(12) United States Patent
Roux et al.

(10) Patent No.: US 11,408,801 B2
(45) Date of Patent: *Aug. 9, 2022

(54) OPTICAL TIME-DOMAIN REFLECTOMETER DEVICE INCLUDING MULTIPLE AND BI-DIRECTIONAL OPTICAL TESTING FOR FIBER ANALYSIS

(71) Applicant: VIAVI SOLUTIONS INC., San Jose, CA (US)

(72) Inventors: Charlène Roux, Chamboeuf (FR); Olivier Receveur, Saint Marcellin en Forez (FR)

(73) Assignee: VIAVI SOLUTIONS INC., Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/169,132

(22) Filed: Feb. 5, 2021

(65) Prior Publication Data

US 2021/0181060 A1   Jun. 17, 2021

Related U.S. Application Data

(63) Continuation of application No. 16/152,046, filed on Oct. 4, 2018, now Pat. No. 10,914,655.

(30) Foreign Application Priority Data

Aug. 28, 2018   (FR) ..................... 1857711

(51) Int. Cl.
   *G01M 11/00*   (2006.01)
   *H01L 21/768*   (2006.01)

(52) U.S. Cl.
   CPC .... *G01M 11/3145* (2013.01); *G01M 11/3154* (2013.01); *H01L 21/76898* (2013.01)

(58) Field of Classification Search
   CPC ......... G01M 11/3145; G01M 11/3154; G01M 11/3109; H04B 10/071
   See application file for complete search history.

(56) References Cited

U.S. PATENT DOCUMENTS

| 4,823,166 A | * | 4/1989 | Hartog | ................... G01D 5/268 250/227.19 |
| 5,144,125 A | | 9/1992 | Carter et al. | |

(Continued)

FOREIGN PATENT DOCUMENTS

| EP | 2755008 | 7/2014 |
| WO | 2012/129453 | 9/2012 |
| WO | 2019/235152 | 12/2019 |

OTHER PUBLICATIONS

Lee et al., "A Practical In-Service Supervisory Technique Using Reflected-Pulse Detection Based on OTDR for Optical Amplified Passive Branched CATV Networks", IEEE Photonics Technology Letters, vol. 11, No. 5, May 1999, pp. 611-613.

*Primary Examiner* — Sang H Nguyen
(74) *Attorney, Agent, or Firm* — Mannava & Kang, P.C.

(57) ABSTRACT

In some examples, an optical time-domain reflectometer (OTDR) device may include a laser source to emit a laser beam into a device under test (DUT), and a connection port to connect the OTDR device to a first end of the DUT, where the OTDR device may be designated a first OTDR device. A sensor display generator may determine a length of the DUT, receive, from a second OTDR device connectable to a second opposite end of the DUT, and over the DUT, OTDR information acquired by the second OTDR device in a direction from the second OTDR device towards the first OTDR device, and ascertain, based on acquisition by the first OTDR device, further OTDR information in a direction from the first OTDR device towards the second OTDR device. The sensor display generator may generate a bi- (Continued)

directional combined schematic display that includes relevant optical events with respect to the DUT.

20 Claims, 30 Drawing Sheets

(56) References Cited

U.S. PATENT DOCUMENTS

| | | | |
|---|---|---|---|
| 5,534,994 A * | 7/1996 | Hanson | G01M 11/3109 |
| | | | 356/73.1 |
| 6,369,883 B1 | 4/2002 | Clark | |
| 6,445,445 B1 * | 9/2002 | Nakayama | G01M 11/3136 |
| | | | 356/73.1 |
| 6,456,685 B1 | 9/2002 | LaGasse | |
| 6,781,678 B2 * | 8/2004 | Aoki | G01M 11/3127 |
| | | | 356/73.1 |
| 7,256,878 B1 | 8/2007 | Asher et al. | |
| 8,222,906 B2 * | 7/2012 | Wyar | H04L 41/0677 |
| | | | 324/533 |
| 8,576,389 B2 * | 11/2013 | Perron | G01M 11/3145 |
| | | | 356/73.1 |
| 9,140,624 B2 | 9/2015 | Bao et al. | |
| 9,170,173 B2 * | 10/2015 | Perron | G01M 11/3127 |
| 9,240,836 B1 | 1/2016 | Chen et al. | |
| 9,341,543 B2 | 5/2016 | Viswanathan | |
| 9,825,700 B2 | 11/2017 | Ruchet et al. | |
| 10,101,240 B1 | 10/2018 | Bonche et al. | |
| 10,274,398 B2 | 4/2019 | Na | |
| 2004/0047629 A1 * | 3/2004 | Evangelides, Jr. | H04B 10/071 |
| | | | 398/33 |
| 2004/0218171 A1 | 11/2004 | Peerlings | |
| 2006/0244949 A1 * | 11/2006 | Chen | G01M 11/3163 |
| | | | 356/73.1 |
| 2007/0091297 A1 | 4/2007 | Beller | |
| 2008/0225377 A1 | 9/2008 | Beller | |
| 2012/0045205 A1 | 2/2012 | Perron et al. | |
| 2013/0155391 A1 * | 6/2013 | Achten | G01M 11/31 |
| | | | 356/73.1 |
| 2014/0009763 A1 | 1/2014 | Bao et al. | |
| 2014/0140691 A1 | 5/2014 | Reaves et al. | |
| 2014/0198311 A1 * | 7/2014 | L'Heureux | G01M 11/3118 |
| | | | 356/73.1 |
| 2016/0337034 A1 | 11/2016 | Ruchet et al. | |
| 2017/0294959 A1 | 10/2017 | Archambault et al. | |
| 2018/0266808 A1 | 9/2018 | Shaar et al. | |
| 2018/0313719 A1 | 11/2018 | Bonche et al. | |
| 2018/0372581 A1 | 12/2018 | Bonche et al. | |
| 2020/0041360 A1 | 2/2020 | Champavere | |
| 2020/0072703 A1 | 3/2020 | Roux et al. | |
| 2020/0292416 A1 | 9/2020 | Gagnon et al. | |
| 2020/0326261 A1 | 10/2020 | Champavere | |

* cited by examiner

OPTICAL TIME-DOMAIN REFLECTOMETER DEVICE INCLUDING MULTIPLE AND BI-DIRECTIONAL OPTICAL TESTING FOR FIBER ANALYSIS

PRIORITY

This patent application is a Continuation of commonly assigned and co-pending U.S. patent application Ser. No. 16/152,046, filed Oct. 4, 2018, which claims priority under 35 U.S.C. 119(a)-(d) to French patent application number 1857711, having a filing date of Aug. 28, 2018, the disclosure of which is hereby incorporated by reference in its entirety.

BACKGROUND

An optical fiber may be characterized by a sensor that injects optical pulses into the optical fiber. Based on the injected optical pulses, the sensor may extract light that is scattered or reflected back from points along the optical fiber. The scattered or reflected light that is gathered back may be used to characterize the optical fiber. For example, the scattered or reflected light that is gathered back may be used to detect, locate, and measure events at any location of the optical fiber. The events may include faults at any location of the optical fiber. Other types of features that may be measured by the sensor may include attenuation uniformity and attenuation rate, segment length, and location and insertion loss of connectors, splices, or any other optical components such as splitters or multiplexers.

BRIEF DESCRIPTION OF DRAWINGS

Features of the present disclosure are illustrated by way of examples shown in the following figures. In the following figures, like numerals indicate like elements, in which.

DETAILED DESCRIPTION

Figure 1:
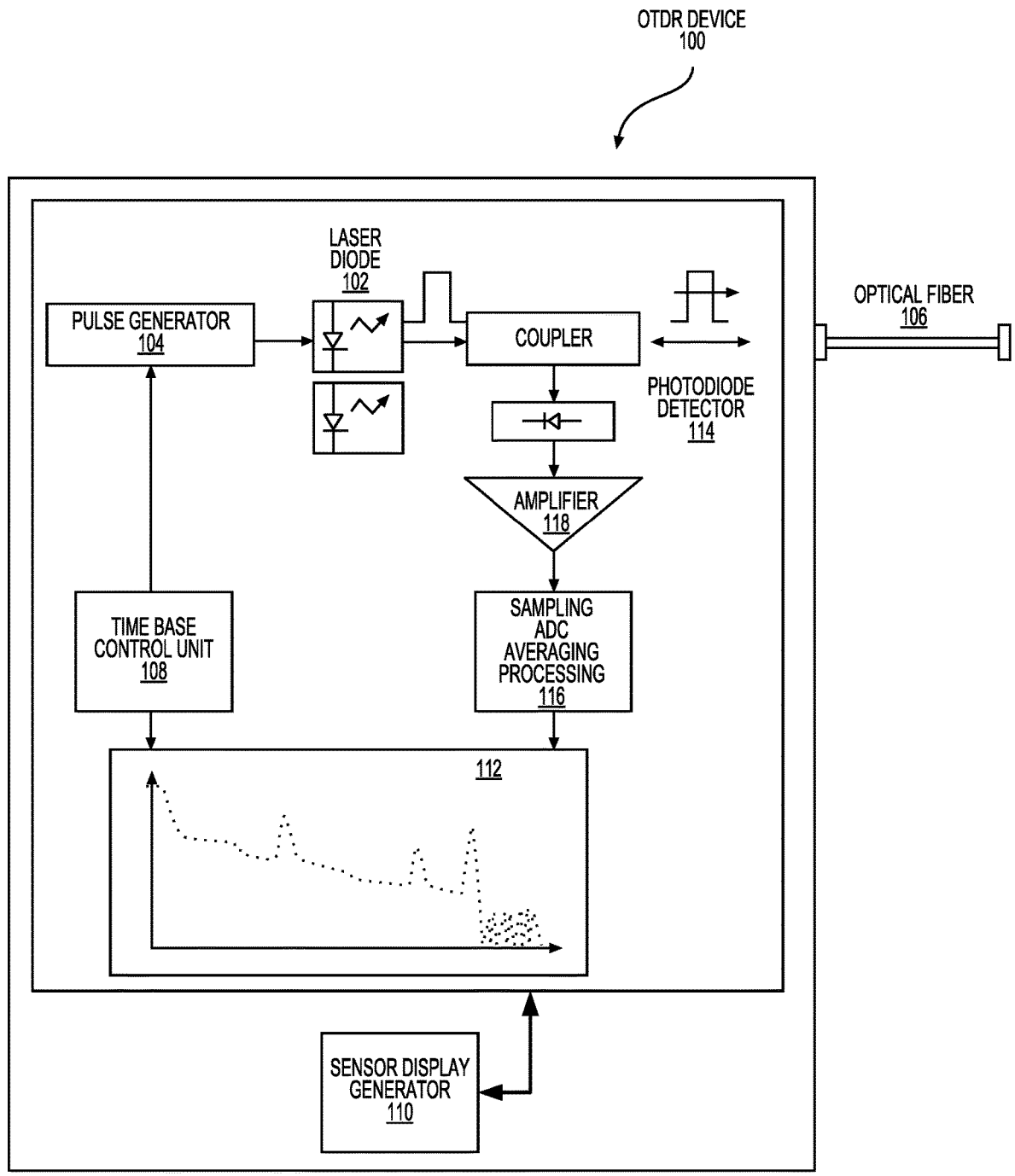
FIG. 1 illustrates an architecture of an optical time-domain reflectometer (OTDR) device, according to an example of the present disclosure.

For simplicity and illustrative purposes, the present disclosure is described by referring mainly to examples thereof. In the following description, details are set forth in order to provide an understanding of the present disclosure. It will be readily apparent however, that the present disclosure may be practiced without limitation to these details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

An optical time-domain reflectometer (OTDR) device is an optoelectronic instrument used to characterize an optical fiber. The OTDR device may inject a series of optical pulses into an optical fiber under test. Based on the injected optical pulses, the OTDR device may extract, from the same end of the optical fiber in which the optical pulses are injected, light that is scattered or reflected back from points along the optical fiber. The scattered or reflected light that is gathered back may be used to characterize the optical fiber. For example, the scattered or reflected light that is gathered back may be used to detect, locate, and measure events at any location of the optical fiber. The events may include faults at any location of the optical fiber. Other types of features that may be measured by the OTDR device include attenuation uniformity and attenuation rate, segment length, bends, fiber end, and location and insertion loss of connectors, splices, or any other optical components such as splitters or multiplexers.

For a device under test (DUT) that may include an optical fiber, an OTDR device may be used to perform insertion loss (IL) and optical continuous wave reflectometer-optical return loss (OCWR)-(ORL) measurements, length measurements, and OTDR measurements. With respect to optical network deployments, such as passive optical network (PON) applications that may use optical splitters with relatively high attenuation, a bi-directional OTDR measurement may be needed to provide a complete view of optical events along the DUT, and particularly, optical events after a splitter(s) when viewed in a measurement direction. With a single OTDR measurement from a given location, it may be technically challenging to detect all optical events due to factors such as limited pulse width dynamic range and/or resolution.

In order to address at least the aforementioned technical challenges related to OTDR measurements, an OTDR device is disclosed herein, and provides for the performance of multiple and bi-directional optical measurements. Multiple optical measurements may be described as different measurements including OCWR-ORL measurements, IL measurements, OTDR measurements, and any other types of measurements performed by an OTDR device. Bi-directional optical measurements may be described as measurements performed in a first direction by an OTDR device disposed at one end (e.g., at location-A) of a DUT towards an OTDR device disposed at another end (e.g., at location-B) of the DUT, and vise-versa in a second opposite direction (e.g., from the OTDR device disposed at location-B to the OTDR device disposed at location-A). The OTDR device disclosed herein may provide for the exchange the optical test results using the DUT to provide a complete characterization of the DUT. In this regard, a first OTDR device may be connected to a first end of the DUT and a second ORDR device may be connected to another end of the DUT, where the DUT may be used to exchange optical test results. Further, a sensor display generator of the OTDR device may generate a sensor display that may include a bi-directional combined schematic display of all relevant optical events for DUT.

As disclosed herein, the OTDR device disclosed herein may perform bi-directional IL and OCWR-ORL measurements. In this regard, the bi-directional IL and OCWR-ORL measurement results may be exchanged over the DUT between a first OTDR device at one end of the DUT and a second OTDR device at another end of the DUT. The bi-directional IL measurements may be performed by using an OTDR power meter of the first OTDR device, and a laser of the second OTDR device, and the OCWR-ORL measurements may be performed by using the laser source and power meter of the first OTDR device.

According to examples disclosed herein, the first and second OTDR devices may each include one or more laser sources.

According to examples disclosed herein, the OTDR device disclosed herein may perform a length measurement of the DUT. In this regard, with respect to the first OTDR device at one end of the DUT and the second OTDR device at the other end of the DUT, the first and second OTDR devices may generate pulses (e.g., identical pulses) to measure the length of the DUT. For a PON topology as disclosed herein, the length measurement may be performed in the direction of a local OTDR device disposed at an ONT to a remote OTDR device disposed at an OLT.

According to examples disclosed herein, the OTDR device disclosed herein may perform bi-directional OTDR measurements, where some optical events may be received by the local OTDR device over the DUT from the remote OTDR device to perform a complete analysis (e.g., to generate the bi-directional combined schematic display). Thus, optical events detected and/or measured by one OTDR device at one end of the DUT (e.g., at an OLT) may be sent to another OTDR device at another end of the DUT (e.g., at an ONT) to generate a sensor display of all optical events between the two OTDR devices. In this regard, an optical event may be detected by determining an existence of the optical event, located by determining a physical location of the optical event along the DUT, and measured by determining a quantitative value associated with the optical event.

According to an example of a fiber to the home (FTTH) network use case disclosed herein, the DUT may include a plurality of splitters. In this regard, a first OTDR device connected to a first end of the DUT may detect and/or measure optical events prior to a splitter, where certain optical events after the splitter may not be detected and/or measured by the first OTDR device. Further, a second OTDR device disposed at a second end of the DUT may detect and/or measure optical events after the splitter that may not be detected and/or measured by the first OTDR device. Thus, the second OTDR device may send the optical events after the splitter to the first OTDR device, which, as disclosed herein, may be used to generate a bi-directional combined schematic display of all relevant optical events associated with the DUT.

According to examples disclosed herein, the OTDR device disclosed herein may include a single port. In this regard, the single port OTDR device may be used to fully characterize a DUT (e.g., an optical fiber link), for example, by using bi-directional measurements, with two single port OTDR devices being connected to opposite ends of the DUT. The OTDR device disclosed herein may provide for the exchange of all the relevant information using the DUT to generate a bi-directional combined schematic display of all optical events with respect to the DUT.

With respect to the OTDR device disclosed herein, "bi-directional measurements" may be described as performing a bi-directional IL/OCWR-ORL, fiber length measurement, and a bi-directional OTDR measurement using two devices at each end of a DUT, where each OTDR device may include a single connection port for connection to the DUT.

The measurement results (e.g., OTDR measurements), as well as optical event parameters (e.g., optical event type, attenuation, reflectance, and distance along the DUT) determined by a remote OTDR device acquisition (e.g., an OTDR device at one end of a DUT at an OLT) may be sent to a local OTDR device (e.g., an OTDR device at another end of the DUT at an ONT), over the DUT, to generate a bi-directional combined schematic display of a fiber path associated with the DUT, where each optical element may be represented by an icon in the bi-directional combined schematic display. The aforementioned optical event parameters may be determined for each optical event as disclosed herein. For example, with respect to attenuation, attenuation values as determined by the local OTDR acquisition, and corresponding attenuation values as determined by the remote OTDR acquisition may be averaged to determine final attenuation values with respect to the DUT. Similarly, an average, a mean, or another calculated value may be determined for each parameter for the combined sensor display as disclosed herein.

FIG. 1 illustrates an architecture of an OTDR device 100 (hereinafter referred to as "OTDR device 100"), according to an example of the present disclosure.

Figure 2:
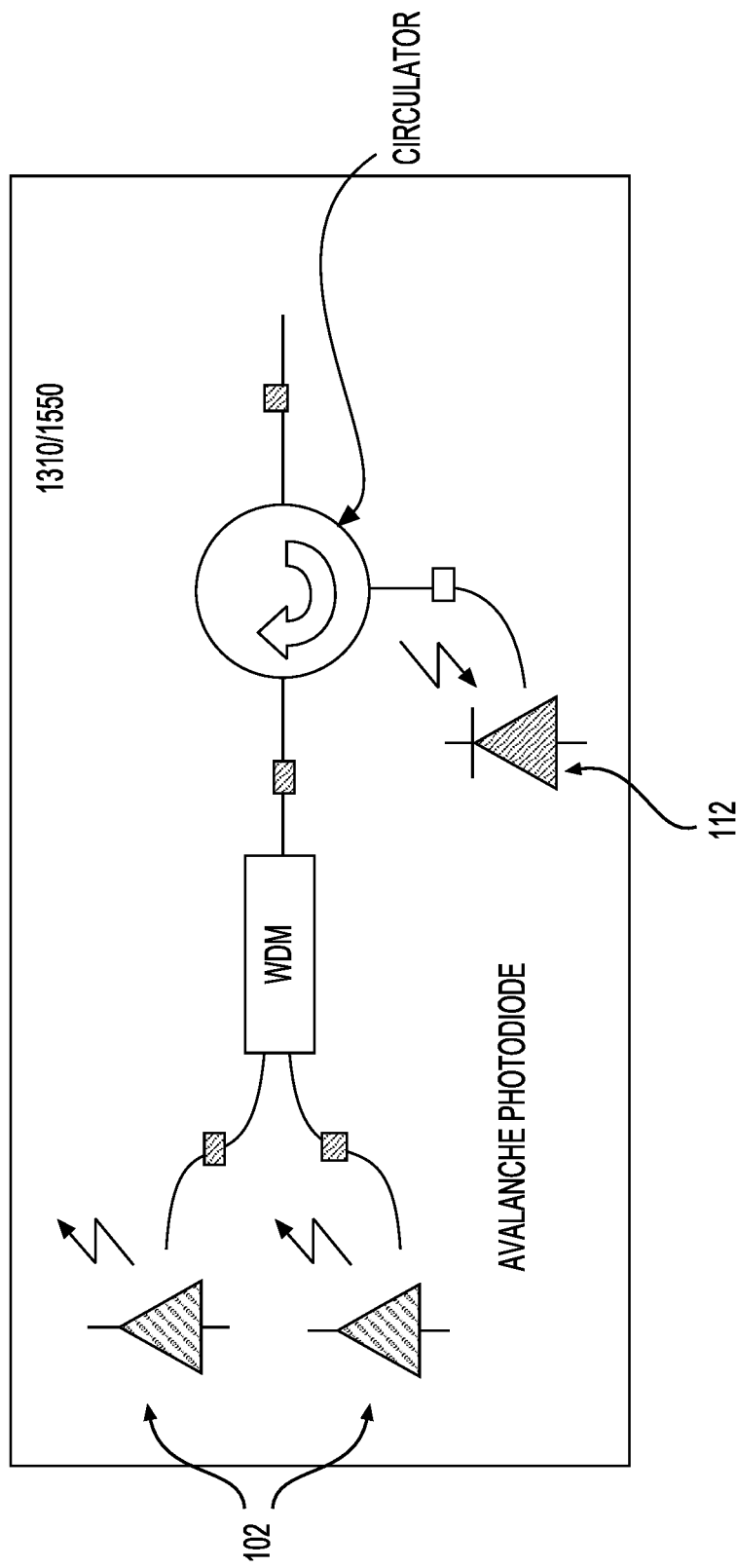
FIG. 2 illustrates an architecture of an optical head with a wavelength division multiplexing (WDM) coupler and a non-reflective coupling device such as a circulator for the OTDR device of FIG. 1, according to an example of the present disclosure.

Referring to FIG. 1, the OTDR device 100, which may be an OTDR, may include emitting laser diode 102 (or a plurality of emitting laser diodes as shown in FIG. 1) to generate light by an electrical current. The emitting laser diode 102 may include a semiconductor. According to examples disclosed herein, the emitting laser diode 102 may include two emitting laser diodes as illustrated in FIG. 1 (or a single emitting laser diode 102), where one emitting laser diode may be used for a first specified wavelength (e.g., 1310 nm as shown in FIG. 2) and a second emitting laser diode may be used for a second specified wavelength (e.g., 1550 nm as shown in FIG. 2). In this regard, FIG. 2 also illustrates an architecture of an optical head with a wavelength division multiplexing (WDM) coupler and a non-reflective coupling device such as a circulator, where the WDM may multiplex a number of optical carrier signals onto a single DUT (e.g., a single optical fiber) by using different wavelengths (e.g., colors) of laser light.

A pulse generator 104 may control a laser diode the sends light pulses into an optical fiber 106 under test (also generally designated DUT).

A time base control unit 108 may control operations of the OTDR device 100. The time base control unit 108 may analyze, for a laser beam, a backscattered signal from the optical fiber 106.

A sensor display generator 110 may analyze data received from various components of the OTDR device 100, as well as data received from another OTDR device (e.g., a remote OTDR device disposed at an OLT as disclosed herein) to generate a sensor display 112 including a bi-directional combined schematic view of optical events along the optical fiber 106.

The sensor display 112 may display measured characteristics of the optical fiber 106, for example, in the form of traces and other attributes as disclosed herein.

A photodiode detector 114 may analyze the return signal from the optical fiber 106 under test to generate a signal proportional to the intensity of an optical field.

A sampling ADC averaging block at 116 may be analyze the amplified return signal from amplifier 118 to also generate a display at the sensor display 112.

As disclosed herein, a first OTDR device (e.g., OTDR-1) may be connected to one (e.g., a local or near end at an ONT) end of the optical fiber 106, and a second OTDR device (OTDR-2) may be connected to another (e.g., a far end at an OLT) end of the optical fiber 106.

According to examples disclosed herein, the OTDR device 100 may include a single connection port for connecting to the optical fiber 106 for performing the IL, OCWR-ORL, fiber length, and OTDR measurements as disclosed herein. The single connection port may eliminate the need for repetitive connection/disconnection of the optical fiber 106 and thus avoid any additional uncertainty.

The emitting laser diode 102 (or diodes) with multiple wavelengths may be used in a continuous mode (e.g., without any pulse generator) at a known power level. Further, the photodiode detector 114 (e.g., an avalanche photodiode (APD) as shown in FIG. 2), may measure received power.

The IL and OCWR-ORL measurements may be performed at the same time by each OTDR device 100 since each OTDR device 100 (e.g., using a non-reflective coupling device as a circulator) may be non-reflective. In this regard, assuming that the remote optical head is non-reflective, the local OTDR device may be able to perform the OCWR-ORL measurement without any additional reflectance (because the remote OTDR is connected to the far end of the optical fiber 106). Thus IL measurement may be performed on the remote OTDR device (while the local OTDR device is measuring OCWR-ORL) because there is no need to bypass the reflectivity of the remote optical head.

The OTDR device 100 may implement frequency modulation (e.g., from a few hundred Hz to several tens of kHz) during laser emission, for example, for recognizing the wavelength emitted from a far end OTDR device (e.g., an OTDR device at a far end of the optical fiber 106 at an OLT), at a local OTDR device (e.g., an OTDR device at a near end of the optical fiber 106 at an ONT). Alternatively or additionally, the OTDR device 100 may implement frequency modulation to synchronize measurement flow between the two OTDR devices (e.g., the OTDR devices at the far and near ends of the optical fiber 106) using flags with predetermined frequencies. Alternatively or additionally, the OTDR device 100 may implement frequency modulation due to frequency encoding, for example, to send OTDR results such as optical event parameters including attenuation, reflectance, distance, optical event type, fiber length, IL, OCWR-ORL, etc.).

Figure 3:
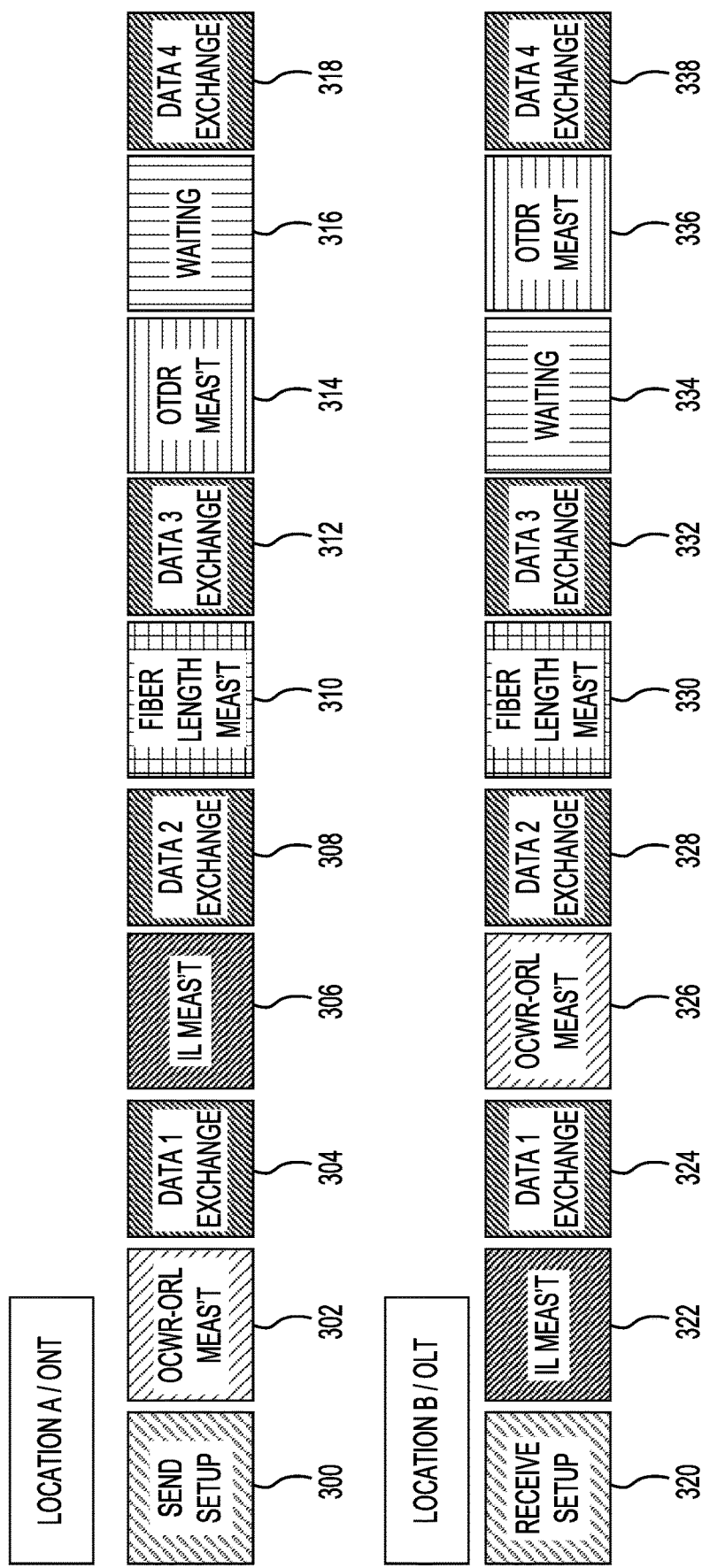
FIG. 3 illustrates a measurement process for the OTDR device of FIG. 1, according to an example of the present disclosure.

FIG. 3 illustrates a measurement process for the OTDR device 100, according to an example of the present disclosure. Referring to FIG. 3, in order for the OTDR device 100 to perform measurements from both ends of the optical fiber 106, and to exchange the measurement setup and all of the results, the measurement process may be defined as illustrated to include, at a location-A of the optical fiber 106 (which may be an ONT), sending (e.g., by the sensor display generator 110 of a first OTDR device (e.g., OTDR-1)), at 300, setup information associated with the first OTDR device to the sensor display generator 110 of a second OTDR device (e.g., OTDR-2) at a location-B of the optical fiber 106 (which may be an OLT)). At 320, the sensor display generator 110 of the second OTDR device may receive the setup information associated with the first OTDR device. The setup information may include acquisition parameters (e.g., wavelength used, type of measurement (IL, OCWR-ORL, fiber length, OTDR)), and link information (e.g., fiber number, fiber identification, cable identification, network topology, etc.).

At 302, the first OTDR device may perform OCWR-ORL measurements with respect to the optical fiber 106 in the direction from location-A to location-B. Further, at 322, the second OTDR device may perform IL measurements with respect to the optical fiber 106 in the direction from location-B to location-A.

At 304, the first OTDR device may send the OCWR-ORL measurements performed at 302 to the second OTDR device. Similarly, at 324, the second OTDR device may send the IL measurements performed at 322 to the first OTDR device. In this regard, the sensor display generator 110 of each respective OTDR may send and receive the aforementioned measurements performed by the OTDRs.

At 306, the first OTDR device may perform IL measurements with respect to the optical fiber 106 in the direction from location-A to location-B. Similarly, at 326, the second OTDR device may perform OCWR-ORL measurements with respect to the optical fiber in the direction from location-B to location-A.

At 308, the first OTDR device may send the IL measurements performed at 306 to the second OTDR device. Similarly, at 328, the second OTDR may send the OCWR-ORL measurements performed at 326 to the first OTDR device. In this regard, the sensor display generator 110 of each respective OTDR device may send and receive the aforementioned measurements performed by the OTDR devices.

At 310 and 330, the first OTDR device may operate in conjunction with the second OTDR device to perform fiber length measurement with respect to the optical fiber 106 in the direction from location-A to location-B. In this regard, at 312 and 332, as disclosed herein, appropriate data may be exchanged between the first OTDR device and the second OTDR device to perform the fiber length measurement at 310 and 330.

At 314, the first OTDR device may perform OTDR acquisition with respect to the optical fiber 106 in the direction from location-A to location-B. At 334, the second OTDR device may be placed in a waiting mode during the OTDR acquisition by the first OTDR device.

At 316, the second OTDR device may perform OTDR acquisition with respect to the optical fiber 106 in the direction from location-B to location-A. At 316, the first OTDR device may be placed in a waiting mode during the OTDR acquisition by the second OTDR device.

At 338, the second OTDR device may send the OTDR acquisition performed at 336 to the first OTDR device. At 318, the first OTDR device may receive the OTDR acquisition performed at 336 by the second OTDR device. In this regard, the sensor display generator 110 of the second OTDR device may send the OTDR acquisition performed at 336 to the sensor display generator 110 of the first OTDR device, which, at 318, may receive the OTDR acquisition performed at 336.

According to examples disclosed herein, for the OTDR device 100 (e.g., the first and second OTDR devices), the measurement process disclosed with respect to FIG. 3 may be commenced by actuation of a measurement start switch (not shown). In this regard, the measurement start switch may be actuated independently on the first and second OTDR devices. During the measurement, a current test may be displayed on the sensor display 112 of the corresponding OTDR device, and the sensor display 112 may include a result table and a schematic view that may be populated once the measurement results have been received (e.g., by the first or local OTDR device).

Figure 4:
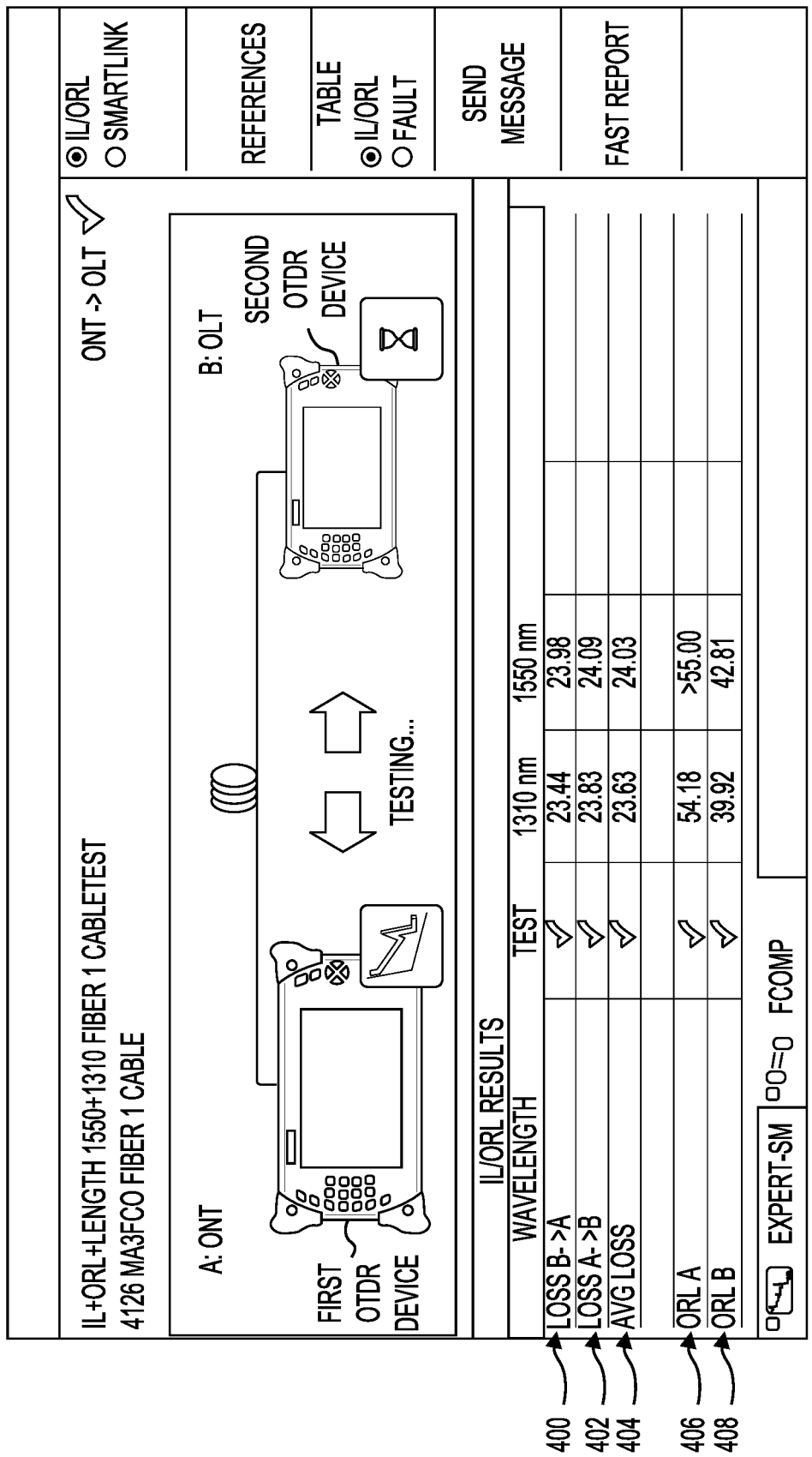
FIG. 4 illustrates a sensor display of a test including an OTDR acquisition from an optical network terminal (ONT) location, using the OTDR device of FIG. 1, according to an example of the present disclosure.

FIG. 4 illustrates a sensor display of a test including an OTDR acquisition from an ONT location, using the OTDR device 100, according to an example of the present disclosure. In this regard, an operator may commence a measurement process when the first OTDR device and the second OTDR device are optically connected to the optical fiber 106. With respect to FIG. 4, the locations of the first and second OTDR devices may be reversed compared to the locations illustrated in FIG. 4. Thus, for each of the examples disclosed herein with respect to FIGS. 1 to 30, the designations first OTDR device and second OTDR device are merely used as reference labels for different OTDR devices, and do not otherwise limit or define the functionality of an OTDR device. Moreover, as disclosed herein with respect to the sensor display 112, IL from location-B to location-A is displayed at 400, IL from location-A to location-B is displayed at 402, and average IL is displayed at 404. Further, OCWR-ORL from location-A to location-B is displayed at 406, and OCWR-ORL from location-B to location-A is displayed at 408.

Figure 5:
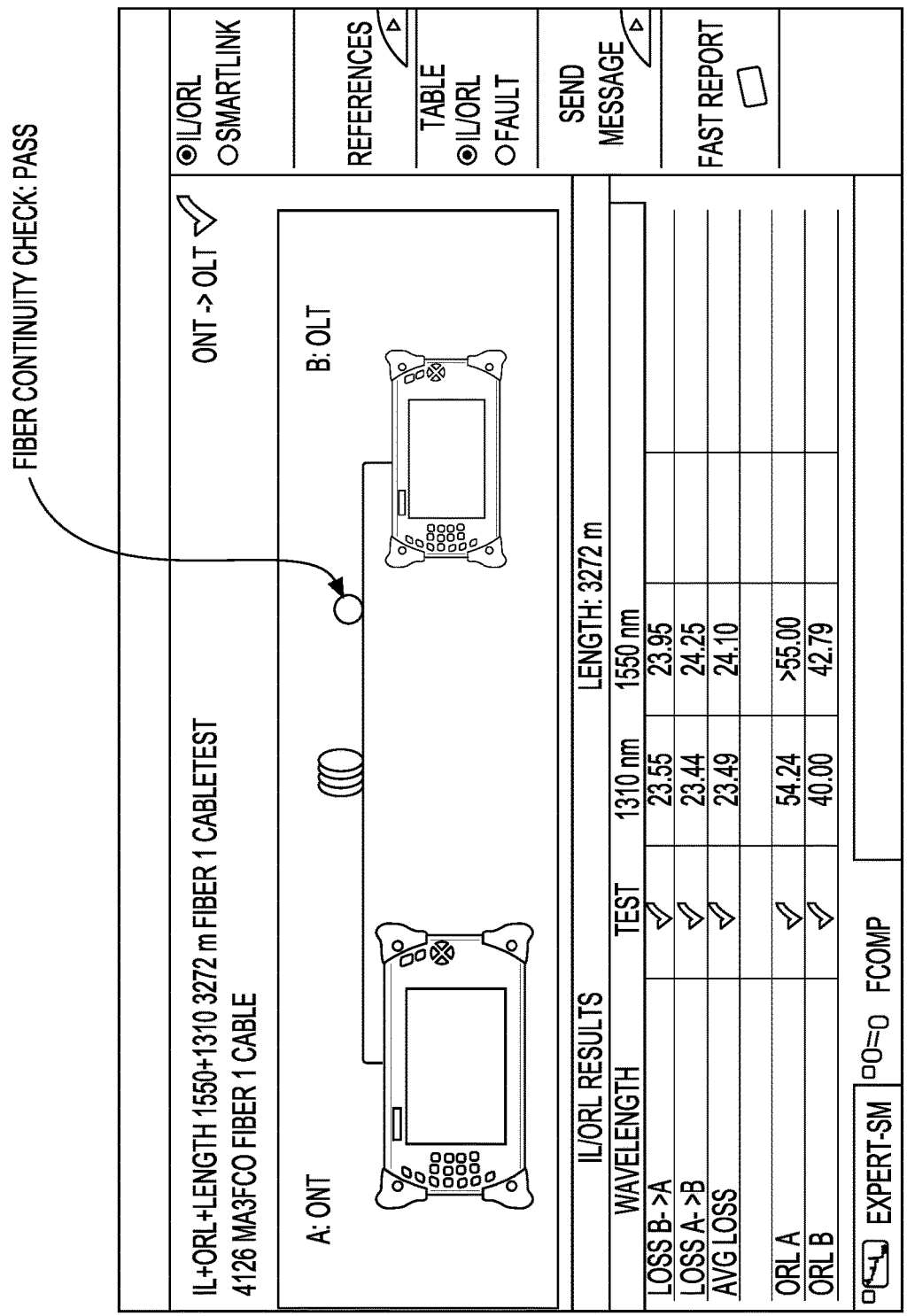
FIG. 5 illustrates a sensor display of a passed fiber continuity check, using the OTDR device of FIG. 1, according to an example of the present disclosure.
Figure 6:
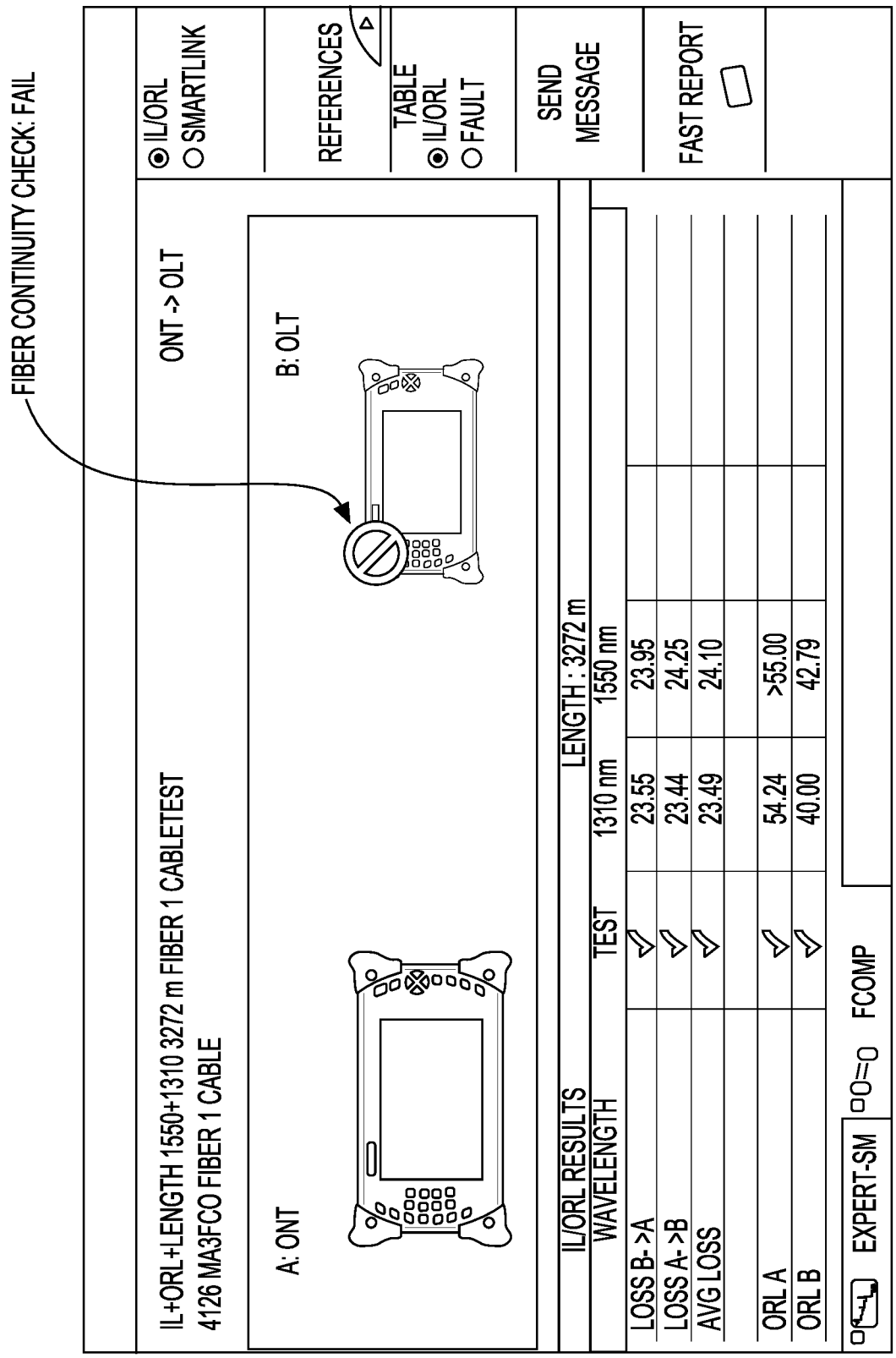
FIG. 6 illustrates a sensor display of a failed fiber continuity check, using the OTDR device of FIG. 1, according to an example of the present disclosure.

FIG. 5 illustrates a sensor display of a passed fiber continuity check, using the OTDR device 100, according to an example of the present disclosure. FIG. 6 illustrates a sensor display of a failed fiber continuity check, using the OTDR device 100, according to an example of the present disclosure.

Referring to FIGS. 5 and 6, the sensor display generator 110 of the OTDR device may perform a "fiber continuity check" operation by sending and receiving a "flag" with a dedicated frequency modulation to check the connectivity status between the first and second OTDR devices that are to be connected to the optical fiber 106. As shown in FIG. 5, once the flags are continuously detected by a remote unit (e.g., the second OTDR device connected to a far end of the optical fiber 106), the connection may be established (e.g., "pass" status displayed), and a user may commence the measurement process. Alternatively, as shown in FIG. 6, absent the establishment of a connection, a "fail" status may be displayed at the first OTDR device (e.g., the OTDR device connected to a near end of the optical fiber 106).

As disclosed herein, the OTDR device as disclosed herein may provide for the performance of multiple and bi-directional optical measurements. With respect to bi-directional IL measurements, in order to measure overall attenuation in the optical fiber 106, a known level of light may be injected in one end of the optical fiber 106, and a level of light that exits at the other end of the optical fiber 106 may be measured. Alternatively, an insertion loss technique may be used to measure the attenuation across the optical fiber 106, a passive component, or an optical link. Alternatively, with a substitution technique, the output from a source fiber and a reference fiber may be measured directly, and a measurement may be obtained with the optical fiber 106 being added for testing. The difference between the two results may provide the attenuation of the optical fiber 106. The IL measurement may be performed by using two OTDR devices (using the emitting laser diode 102 (in continuous mode) and the photodiode detector 114 used as a 'built in' power meter), with both light sources and the power meter being connected to the same port.

With respect to OCWR-ORL measurement, in order to measure the OCWR-ORL, an optical continuous wave reflectometer technique may be used, where the light source (e.g., the emitting laser diode 102) may launch a single wavelength of light at a known power level (PO) into the optical fiber 106. Assuming a reference optical measurement using a non-reflective termination plug, the OCWR-ORL may be determined after measuring the level of reflected optical power in the optical fiber 106. Using two OTDR devices, both light sources and the power meter may be connected to the same port.

Figure 7:
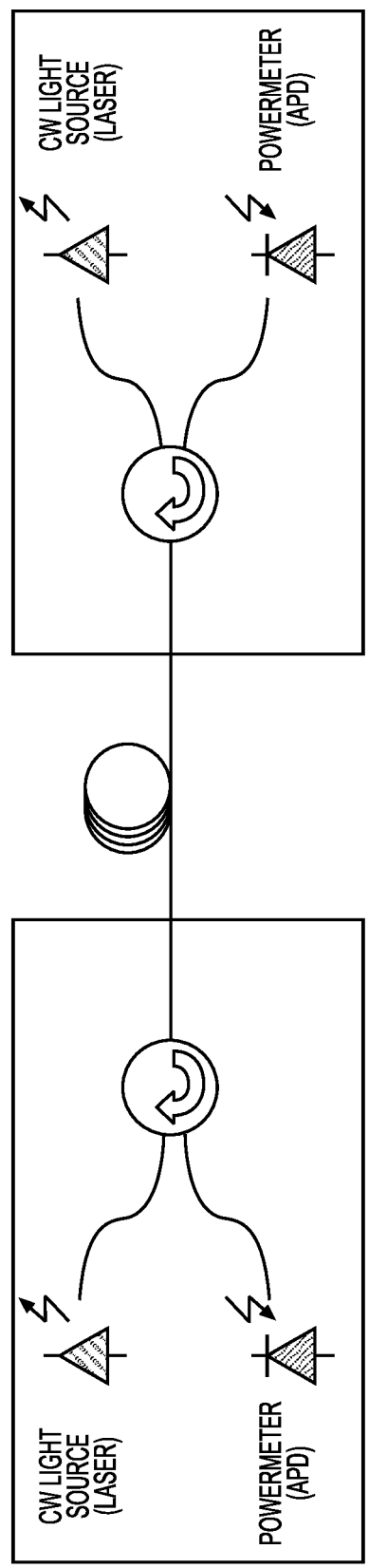
FIG. 7 illustrates bi-directional insertion loss (IL) and optical continuous wave reflectometer-optical return loss (OCWR)-(ORL) measurement using the OTDR device of FIG. 1, according to an example of the present disclosure.

FIG. 7 illustrates bi-directional IL and OCWR-ORL measurement using the OTDR device 100, according to an example of the present disclosure.

Referring to FIG. 7, for the OTDR device 100 disclosed herein, the bi-directional IL and OCWR-ORL measurements may be performed at the same time since the remote optical connection is non-reflective. For example, as shown in FIG. 7, a circulator may be used to avoid any high reflectance.

For the bi-directional IL and OCWR-ORL measurements, when the OTDR device #1 is emitting, OCWR-ORL measurement may be performed at the location-A while IL measurement may be performed by OTDR device #2 at the location-B. Further, when OTDR device #2 is emitting, OCWR-ORL measurement may be performed at the location-B while IL measurement may be performed by OTDR device #1 at the location-A.

Figure 8:
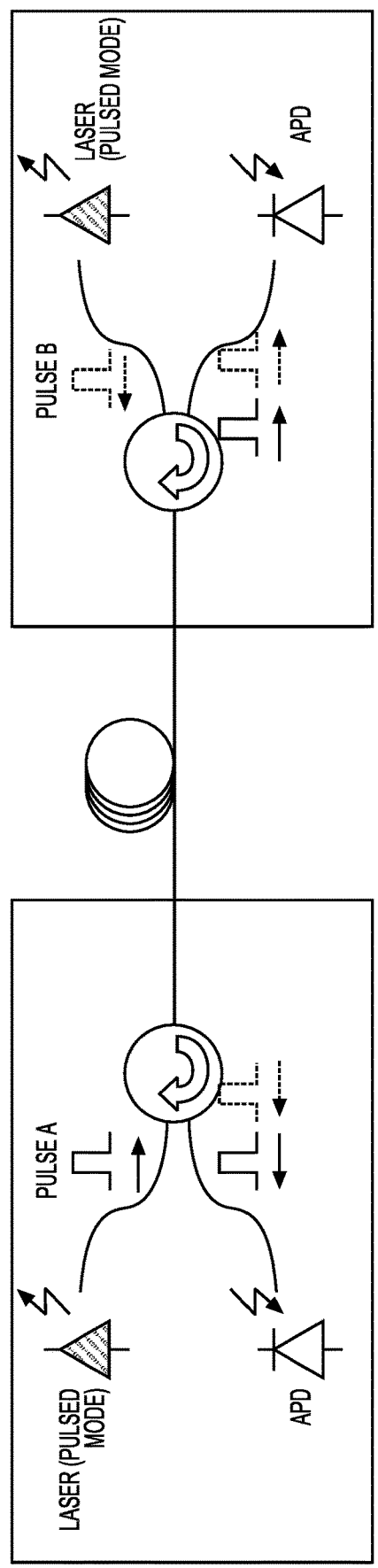
FIG. 8 illustrates optical fiber length measurement using the OTDR device of FIG. 1, according to an example of the present disclosure.

FIG. 8 illustrates optical fiber length measurement using the OTDR device 100, according to an example of the present disclosure.

With respect to optical fiber length measurement, optical fiber length measurement may be based on propagation time measurement using two OTDR devices at opposite ends of the optical fiber 106. In this regard, optical pulses may be generated continuously from both ends of the optical fiber 106, and the fiber length measurement may be performed.

Further, OTDR acquisition parameters may be specified to be the same to perform this measurement.

With respect to bi-directional OTDR measurement, the OTDR device 100 may detect, locate, and measure optical events at any location on the optical fiber 106. The ability of the OTDR device 100 to characterize the optical fiber 106 may be based on detecting relatively small signals that are returned to the OTDR device 100 in response to the injection of large signal. In this regard, the OTDR device 100 may depend on optical phenomena that may include Rayleigh scattering and Fresnel reflections. The OTDR device 100 may inject light energy into the optical fiber 106 through the emitting laser diode 102 and the pulse generator 104. The returning light energy may be separated using a coupler/circulator, and may be fed to the photodiode detector 114. The optical signal may be converted to an electrical value, amplified, sampled, and displayed on the sensor display 112. The sensor display generator 110 may read the acquisitions points, perform the averaging calculations, plot these as a logarithmic function, and display the results on the sensor display 112 representing the backscatter signature of the trace. Using sequentially two OTDR devices at both ends of the optical fiber 106 may provide for characterization of an associated optical network under test.

Figure 9:
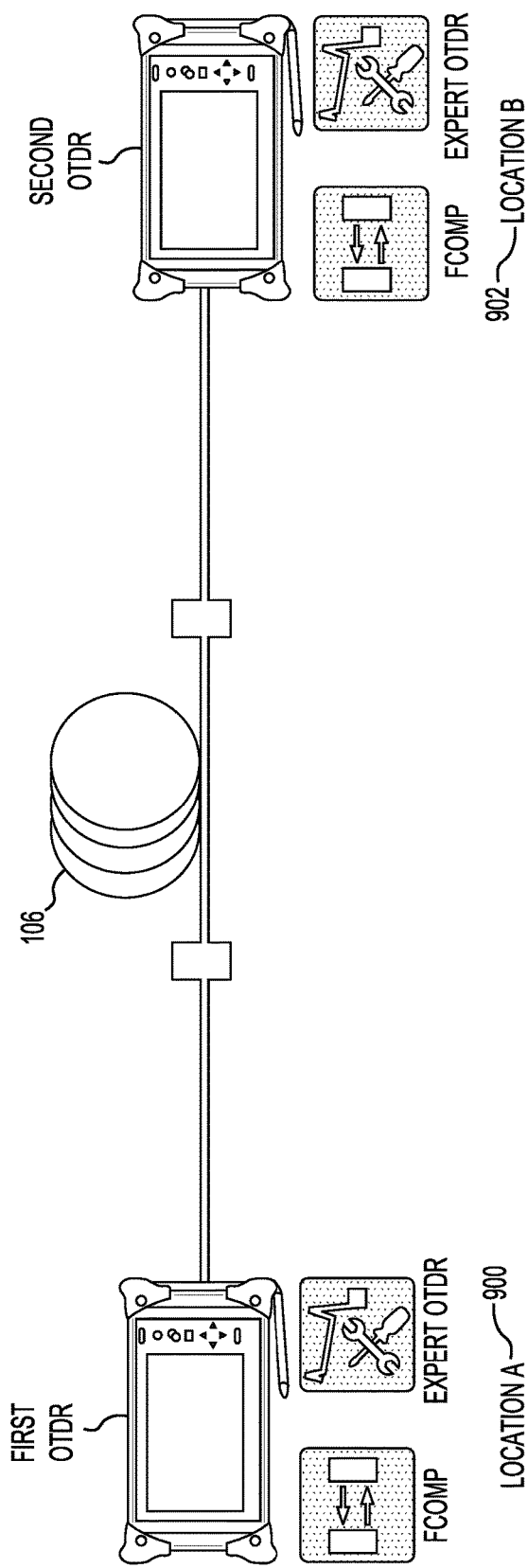
FIG. 9 illustrates a measurement principle for point to point topology for the OTDR device of FIG. 1, according to an example of the present disclosure.

FIG. 9 illustrates a measurement principle for point to point topology for the OTDR device 100, according to an example of the present disclosure.

Referring to FIG. 9, a first OTDR device is shown at location-A at 900, and a second OTDR device is shown at location-B at 902. The DUT may include the optical fiber 106.

Figure 10:
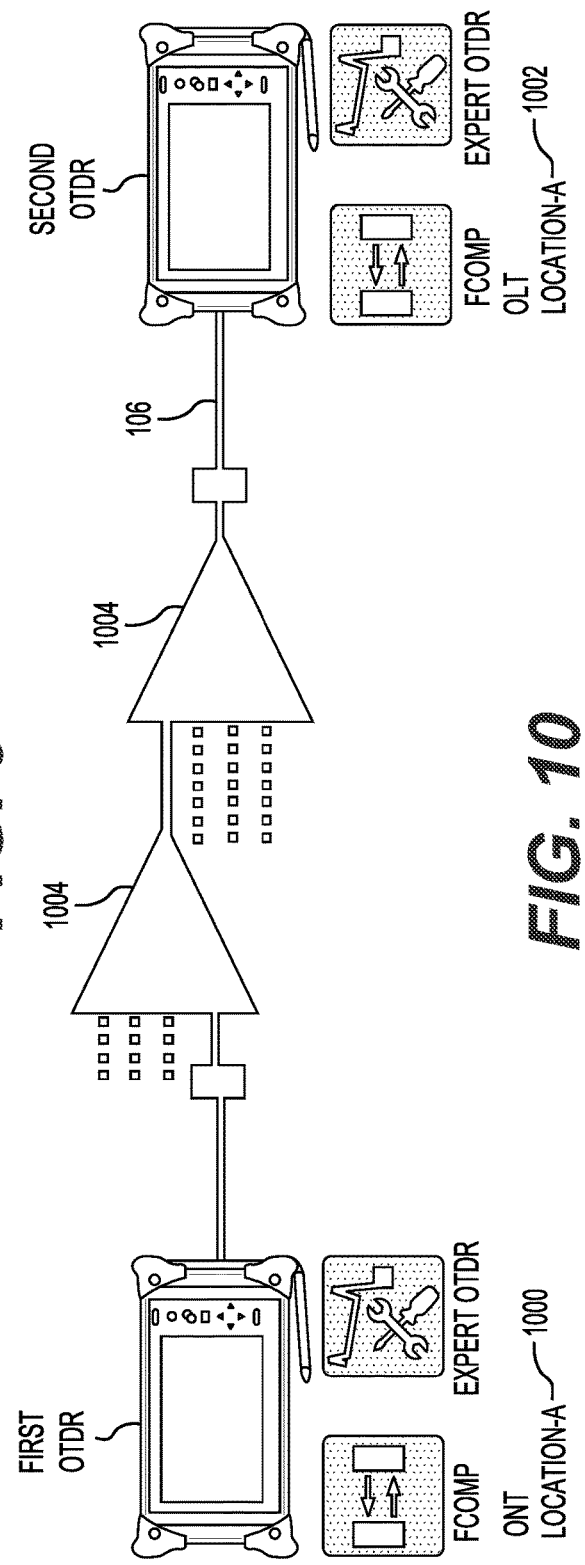
FIG. 10 illustrates a measurement principle for a point to multiple points topology including optical splitters for the OTDR device of FIG. 1, according to an example of the present disclosure.

FIG. 10 illustrates a measurement principle for a point to multiple points topology including optical splitters for the OTDR device 100, according to an example of the present disclosure.

Referring to FIG. 10, a first OTDR device is shown at location-A at 1000, and a second OTDR device is shown at location-B at 1002. Location-A may correspond to an ONT, and location-B may correspond to an OLT. The DUT may include the optical fiber 106. The point to multiple points topology may include splitters at 1004.

Figure 11:
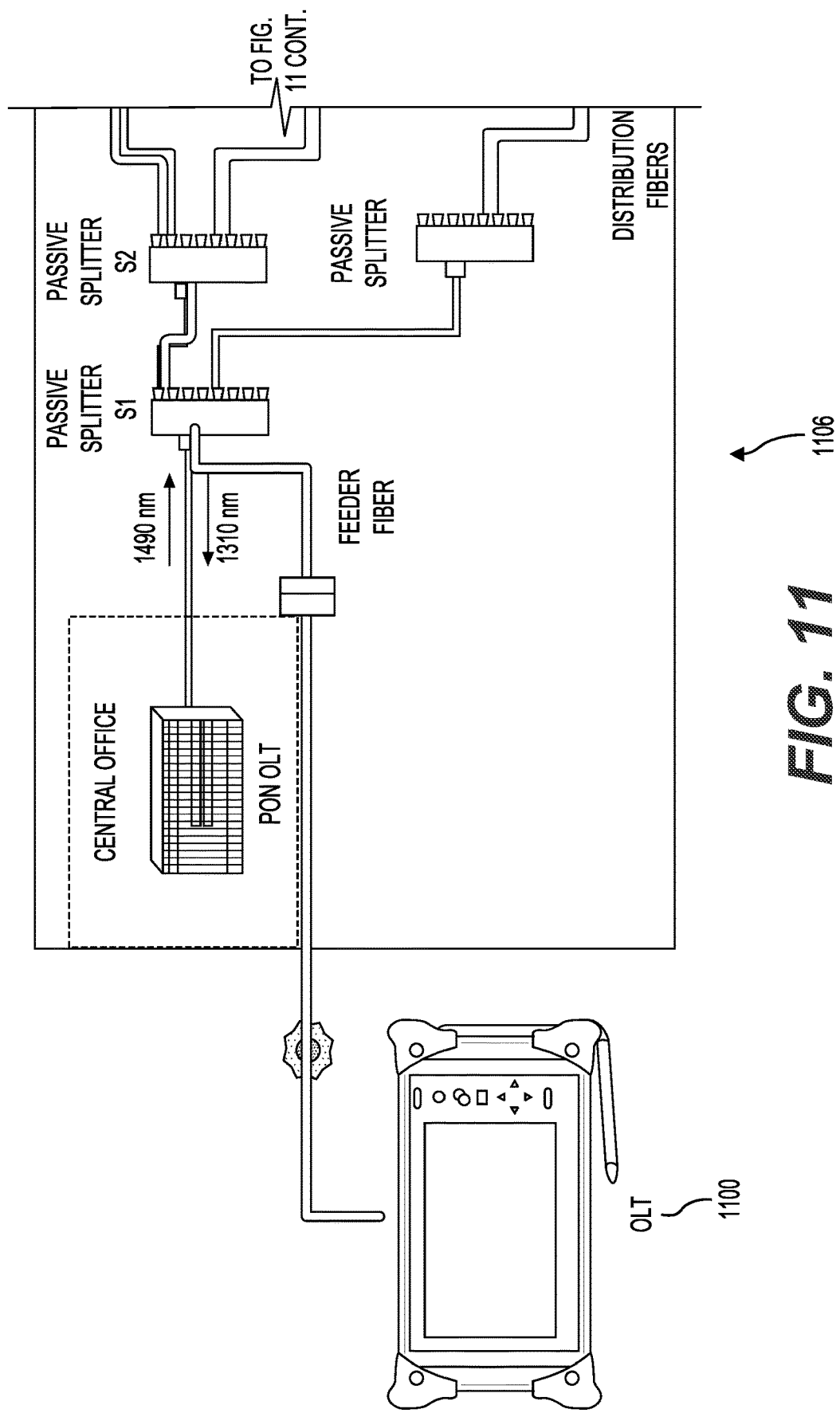
FIG. 11 illustrates a measurement principle for a passive optical network (PON) topology to characterize optical links (e.g., from multiple ONTs to one optical line terminal (OLT)) for the OTDR device of FIG. 1, according to an example of the present disclosure.
Figure 11:
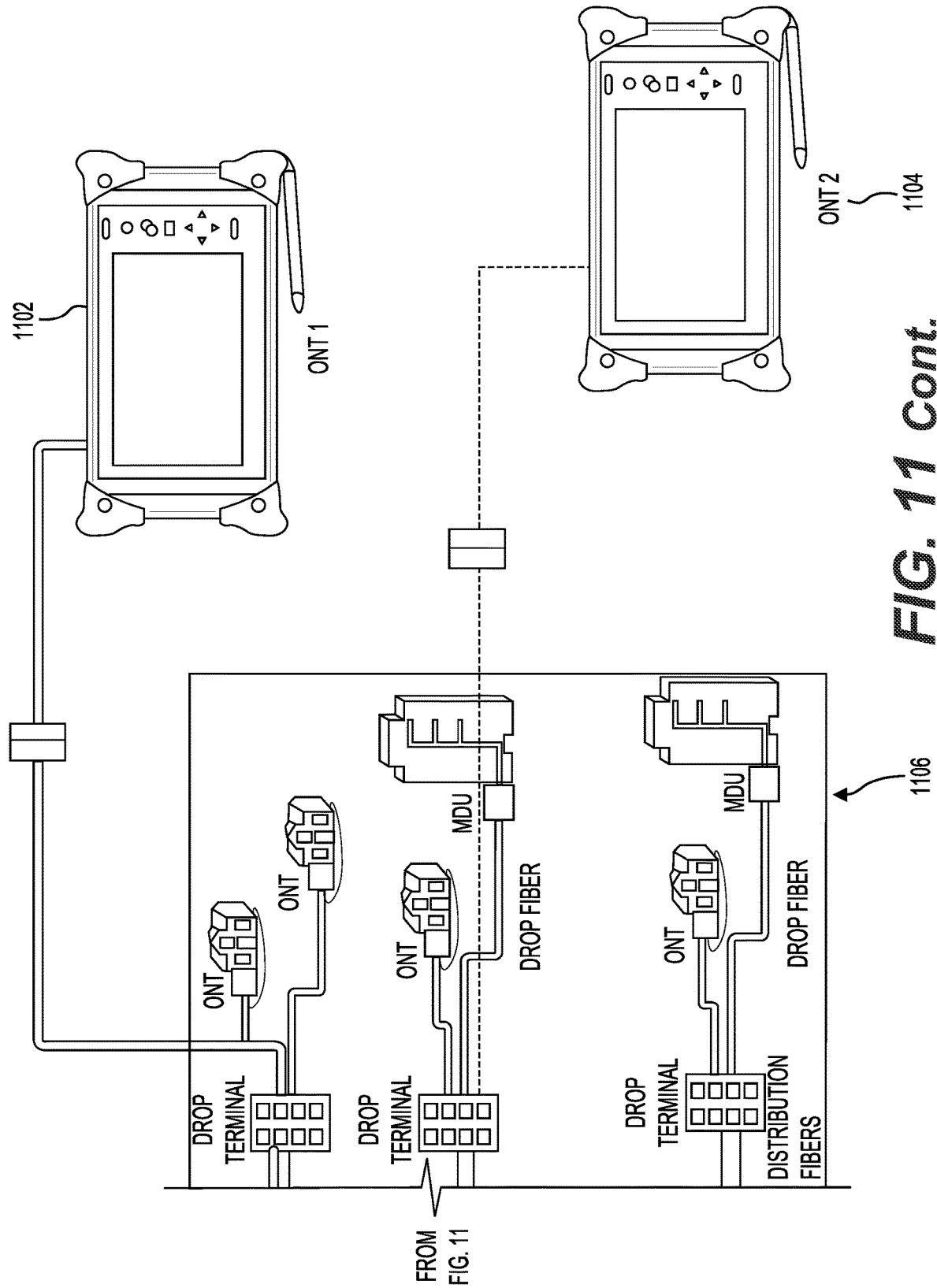

FIG. 11 illustrates a measurement principle for a passive optical network (PON) topology to characterize optical links (e.g., from multiple ONTs to one optical line terminal (OLT)) for the OTDR device 100, according to an example of the present disclosure.

Referring to FIG. 11, in a similar manner as FIG. 10, an OTDR device may be located at an OLT at 1100, and an OTDR device may be located at an ONT (e.g., ONT-1) at 1102 (note that the ONT and OLT orientations are reversed compared to the orientation of FIG. 10). In this regard, the OTDR devices may be used to measure and/or detect optical events with respect to the fiber connection that links these OTDR devices. The OTDR device located at the OLT at 1100 may be retained in place, and the OTDR device located at the ONT (e.g., ONT-1) at 1102 may be moved to the ONT (e.g., ONT-2) at 1104, and these OTDR devices may be used to measure and/or detect optical events with respect to the fiber connection that links these OTDR devices. In this manner, the optical fibers for the entire network at 1106 may be analyzed to measure and/or detect optical events with respect to the network at 1106.

Figure 12:
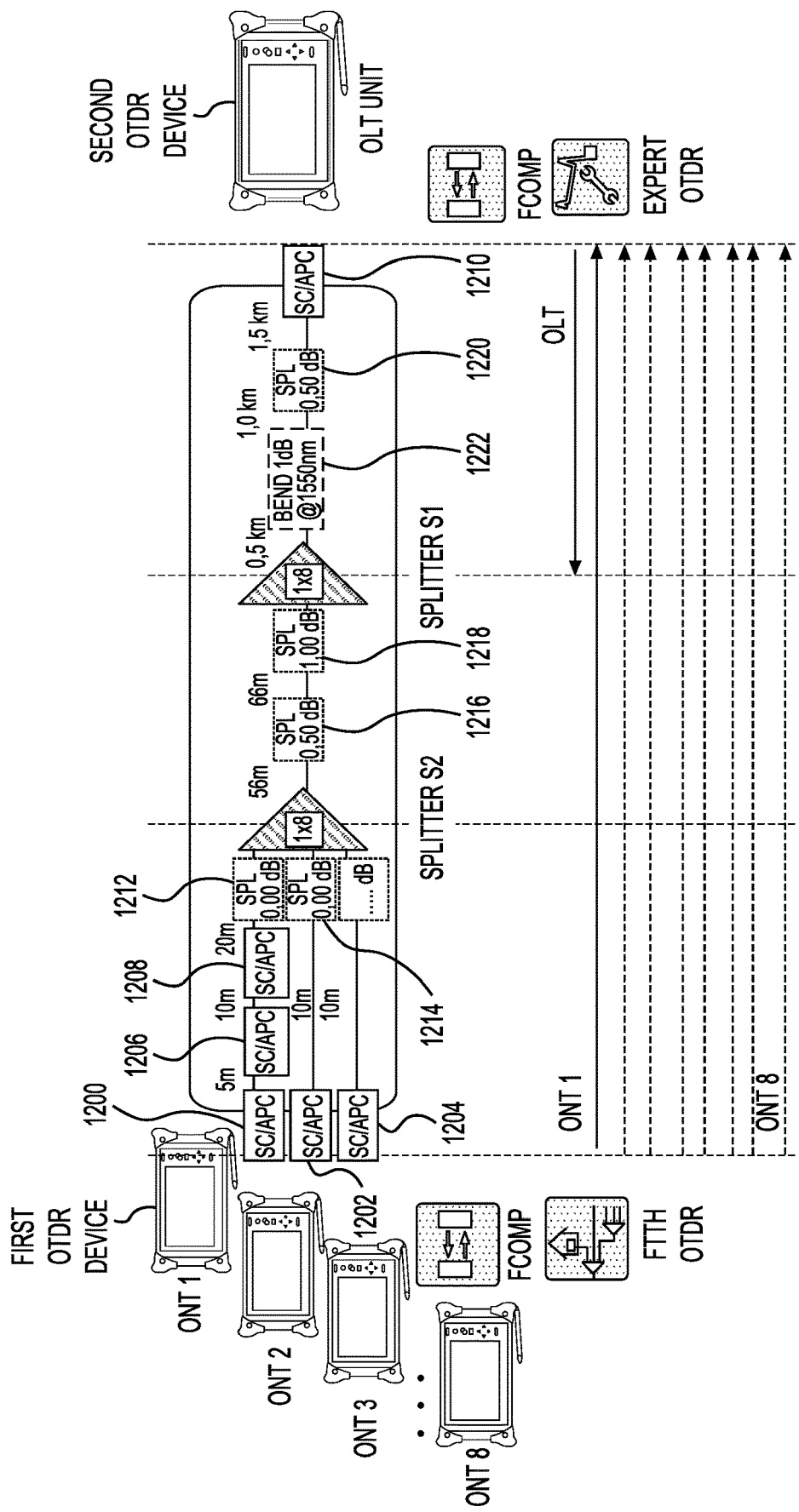
FIG. 12 illustrates a measurement process to characterize fiber to the home (FTTH) networks for the OTDR device of FIG. 1, according to an example of the present disclosure.

FIG. 12 illustrates a measurement process to characterize fiber to the home (FTTH) networks for the OTDR device 100, according to an example of the present disclosure.

Referring to FIG. 12, with respect to an FTTH use case for a PON topology, a first OTDR device may be located on the ONT side as shown and a second OTDR device may be located on the OLT side (e.g., as shown as an "OLT unit" in FIG. 12). In this regard, the same OTDR device that is used for ONT-1 may be used for each of the remaining ONTs (e.g., ONT-1, ONT-2, . . . , ONT-8 for a "1×8" splitter S2). As disclosed herein, the IL/OCWR-ORL, DUT length, and OTDR measurements may be performed in both directions (e.g., from the OLT to each ONT, and from each ONT to the OLT). In this case, some of the optical events that are detected and/or measured by the OTDR device located at the OLT may be sent to the OTDR device located at an ONT to generate a bi-directional combined schematic display including all relevant optical events seen from both sides of the DUT, which may represent an optical fiber that links an ONT to an OLT. The measurement process to characterize FTTH networks may be replicated for each ONT location to characterize the entire network that connects each ONT to the OLT.

According to examples disclosed herein, a measurement process without any optical connection/disconnection (e.g., a "single actuation switch pressed" test) may be implemented as follows.

With respect to measurements performed from an ONTx (e.g., one of ONT-1, ONT-2, . . . , ONT-8, for Splitter-S2 being a "1×8" splitter) to the OLT as shown in FIG. 12, the measurements may include IL measurement, OCWR-ORL measurement, fiber length measurement, and OTDR measurement.

With respect to measurements performed from the OLT to an ONTx (e.g., one of ONT-1, ONT-2, ONT-) as shown in FIG. 12, the measurements may include IL measurement, OCWR-ORL measurement, fiber length measurement, and OTDR measurement (e.g., from OLT to Splitter-S1). The OTDR measurement may be performed once for each ONT.

OTDR acquisition from an ONT to the OLT may be performed for each ONT because the ONTs may not be located in the same location. OTDR acquisition from the OLT to each ONT may be performed once as the optical path may be the same (e.g., from the OLT to the first Splitter-S1). OTDR acquisitions may be managed by the measurement process. For example, an OTDR acquisition from the OLT may be performed once (e.g., for each OLT), with these results being retained in memory and used for each ONT measurement.

As shown in FIG. 12, various optical elements are shown between the first OTDR device, for example, at ONT-1 and Splitter-S1. Further, various optical elements are shown between the Splitter-S1 and the Splitter-S2, and between the Splitter-S2 and the second OTDR device. The optical elements may include connectors (e.g., at 1200, 1202, 1204, 1206, 1208, and 1210), and splices (e.g., at 1212, 1214, 1216, 1218, and 1220), and a bend at 1222.

As disclosed herein, a sensor display 112 may display measured characteristics of the optical fiber 106, for example, in the form of traces and other attributes. In order to generate the sensor display 112, the sensor display generator 110 may implement a bi-directional combined schematic process to generate the sensor display 112 that may include a bi-directional combined schematic display at a local location (e.g., ONT location assuming a PON topology). In this regard, the sensor display generator 110 may implement the bi-directional combined schematic process to display the relevant optical events detected and/or measured along the optical fiber 106.

The bi-directional combined schematic process implemented by the sensor display generator 110 may provide information with respect to optical events physically present along the optical fiber 106 (e.g., splices, connectors, splitters, bends), and may further determine optical parameters for each event (e.g., optical event type, distance, attenuation, and reflectance).

As disclosed herein, certain detections and measurements may be performed in both directions. Further, based on an assumption that some events may not be seen by both OTDR devices (e.g., because of splitter attenuation versus OTDR dynamic specification for example), the sensor display generator 110 may generate the sensor display 112 of all of the optical events detected and measured in both directions (e.g., combination) at one side (e.g., at one of the OTDR devices).

For the bi-directional combined schematic process implemented by the sensor display generator 110, optical event parameters measured on the remote OTDR device (e.g., the OTDR device at an OLT) may be transmitted to the local OTDR device (e.g., the OTDR device at an ONT) over the optical fiber 106.

In order for the sensor display generator 110 to generate the sensor display 112, the sensor display generator 110 may analyze information such as OTDR optical event parameters (e.g., position, attenuation, reflectance, optical event type, etc.) detected and/or measured at a local location (ONT location assuming a PON topology) by an OTDR device at the local location. The analyzed information may further include the OTDR optical event parameters detected and/or measured at a remote location (e.g., OLT location for a PON topology) by an OTDR device at the remote location. Some or all of the analyzed information at the OTDR device at the remote location (e.g., OLT location for a PON topology) may be sent to the OTDR device at the local location (e.g., ONT location for a PON topology) over the optical fiber 106. Considering multiple wavelength acquisitions, the analyzed information may further include OTDR optical event parameters that may be sent for each wavelength used during the OTDR acquisition. The analyzed information may further include fiber length measurement for the optical fiber 106. The analyzed information may further include OTDR acquisition parameters (e.g., pulse width, resolution, etc.) used during the local acquisition (e.g., ONT location assuming a PON topology). The analyzed information may further include OTDR acquisition parameters (e.g., pulse width, resolution, etc.) used during the remote acquisition (e.g., OLT location assuming a PON topology), and sent over the optical fiber 106.

Figure 13:
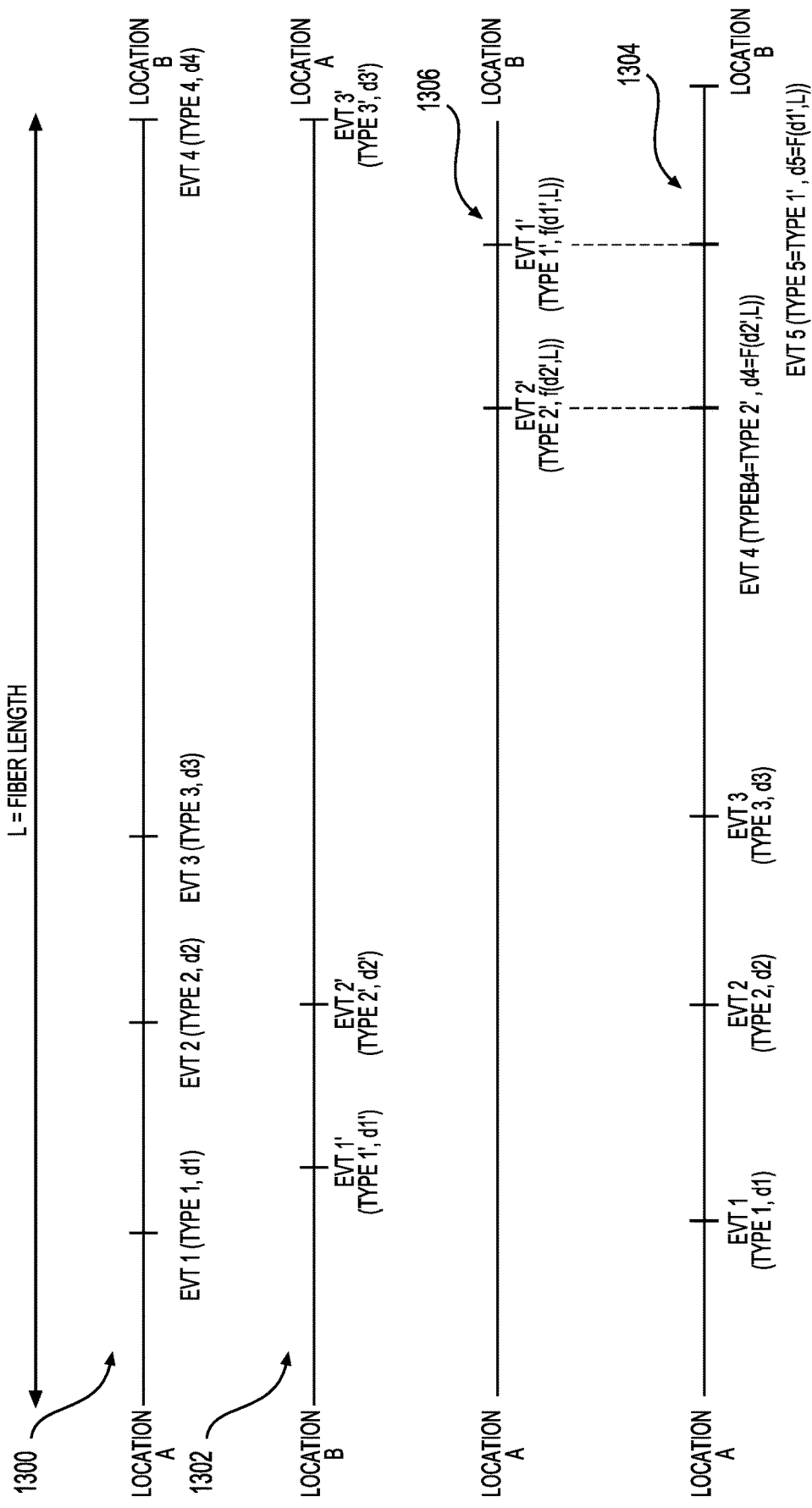
FIG. 13 illustrates application of a bi-directional combined schematic process implemented by the OTDR device of FIG. 1, according to an example of the present disclosure.

FIG. 13 illustrates application of a bi-directional combined schematic process implemented by the OTDR device 100, according to an example of the present disclosure.

Referring to FIG. 13, optical events identified based on OTDR acquisition from location-A to location-B are shown at 1300, optical events identified based on OTDR acquisition from location-B to location-A are shown at 1302, and results of application of the bi-directional combined schematic process implemented by the sensor display generator 110 are shown at 1304. In this regard, the fiber length measurement of the optical fiber 106 may be used to locate optical events from location-A as shown at 1304. At 1304, events #1, #2, and #3 correspond directly to events #1, #2, and #3 at 1300. At 1304, events #4 and #5 correspond to events #2' and #1', where the location-B orientation is reversed as shown at 1306.

The optical events detected and/or measured during the second OTDR measurement (e.g., from location-B) may be determined with the appropriate distance (e.g., origin from location-A instead of origin from location-B). In order to determine the new distance (dx) parameter for each optical event, the fiber length measurement for the optical fiber 106 may be utilized. The fiber length (L) may be obtained, for example, from fiber length measurement (e.g., determine during fiber length measurement, if available) or, as an end of fiber (EOF) optical event measured during OTDR location-A measurement (if available). For example, in order to determine the new distance d5 (e.g., optical event distance for event #5):

$$d5 = f(d'1, L), \text{ where}$$

d'1: Optical event distance for event #1' measured for event #1'.
L: Fiber length measurement.

In order to validate if an optical event (dx) is new (e.g., additional optical event), the optical event type and the optical distance (e.g., according a given distance uncertainty (delta d)) may be specified to not be the same compared to any existing optical event as follows:

di: Optical event distance measured for event #i
d5: Optical event distance determined for event #5
delta d: Optical distance uncertainty $$d5 - \text{delta } d <= di <= d5 + \text{delta } d, \text{ where}$$

$$\text{delta} d = f(pw1, pw2, res1, res2).$$

With pw1, res1: OTDR pulse width and resolution used at location-A
Further, pw2, res2: OTDR pulse width and resolution used at location-B.

According to an example, the sensor display generator 110 of the OTDR device that performed the acquisition may implement measurement quality criteria. Thus, all of the optical events may be sent from the OTDR device at the remote location (OLT location assuming a PON topology) to the OTDR device at the local location (ONT location assuming a PON topology). In order to provide relevant optical events, some of these events may be filtered and/or deleted, and not sent to the local location (e.g., to not be displayed in the sensor display 112 including the bi-directional combined schematic display).

Some of the optical events sent from the OTDR device at the remote location (e.g., OLT location assuming a PON topology) to the OTDR device at the local location (e.g., ONT location assuming a PON topology) may also be filtered and/or deleted directly at the local location (e.g., to not be displayed in the sensor display 112 including the bi-directional combined schematic display).

The following quality criteria may be implemented by the OTDR device at the local location (e.g., ONT location assuming a PON topology), and the OTDR device at the remote location (e.g., OLT location assuming a PON topology) to retain relevant optical events.

According to an example, the sensor display generator 110 may implement the quality criteria based on optical event position (e.g., optical events located after and/or before a splitter may be filtered). For example, assuming a PON topology, all optical events received from the OTDR device at the OLT location and located (e.g., according to the optical distance parameter) before the first splitter (e.g., to the left of splitter S1 in the orientation of FIG. 12) may be filtered and/or deleted. Furthermore, assuming a PON topology, all optical events detected and/or measured at the ONT location, and located (e.g., according to the optical distance parameter) after the first splitter (e.g., to the right of splitter S1 in the orientation of FIG. 12) may also be filtered and/or deleted.

According to another example, the sensor display generator 110 may implement the quality criteria based on optical event type (e.g., "end of fiber" event is not relevant). For example, for a PON topology, an "end of fiber" event may not be sent to the OTDR device at the local location, as the measurement is performed from the OTDR device at the OLT side and the "end of fiber" event may not be relevant with this setup (e.g., do to multiple splitter branches).

With respect to the sensor display 112 that includes the bi-directional combined schematic display, assuming that the same optical event may be detected by both bi-directional OTDR measurements (e.g., optical event at the same position and distance), the sensor display generator 110 may modify the optical event parameters (e.g., optical event type, distance, attenuation, reflectance, etc.) by identifying the most optimum parameter, and/or determining the average value. For example, with respect to the sensor display 112 that includes the bi-directional combined schematic display, the sensor display generator 110 may determine optical event attenuation as a mean value of optical event attenuations determined by the OTDR devices located at the opposite ends of the optical fiber 106. With respect to optical event reflectance, the sensor display generator 110 may determine optical event reflectance as a worst value (e.g., highest reflectance) of optical event reflectance values determined by the OTDR devices located at the opposite ends of the optical fiber 106. Similarly, optical event distance may be determined as the local optical event distance with respect to the OTDR device at the local ONT location for a PON topology, and optical event type may be determined as the local optical event type with respect to the OTDR device at the local ONT location for a PON topology.

Figure 14:
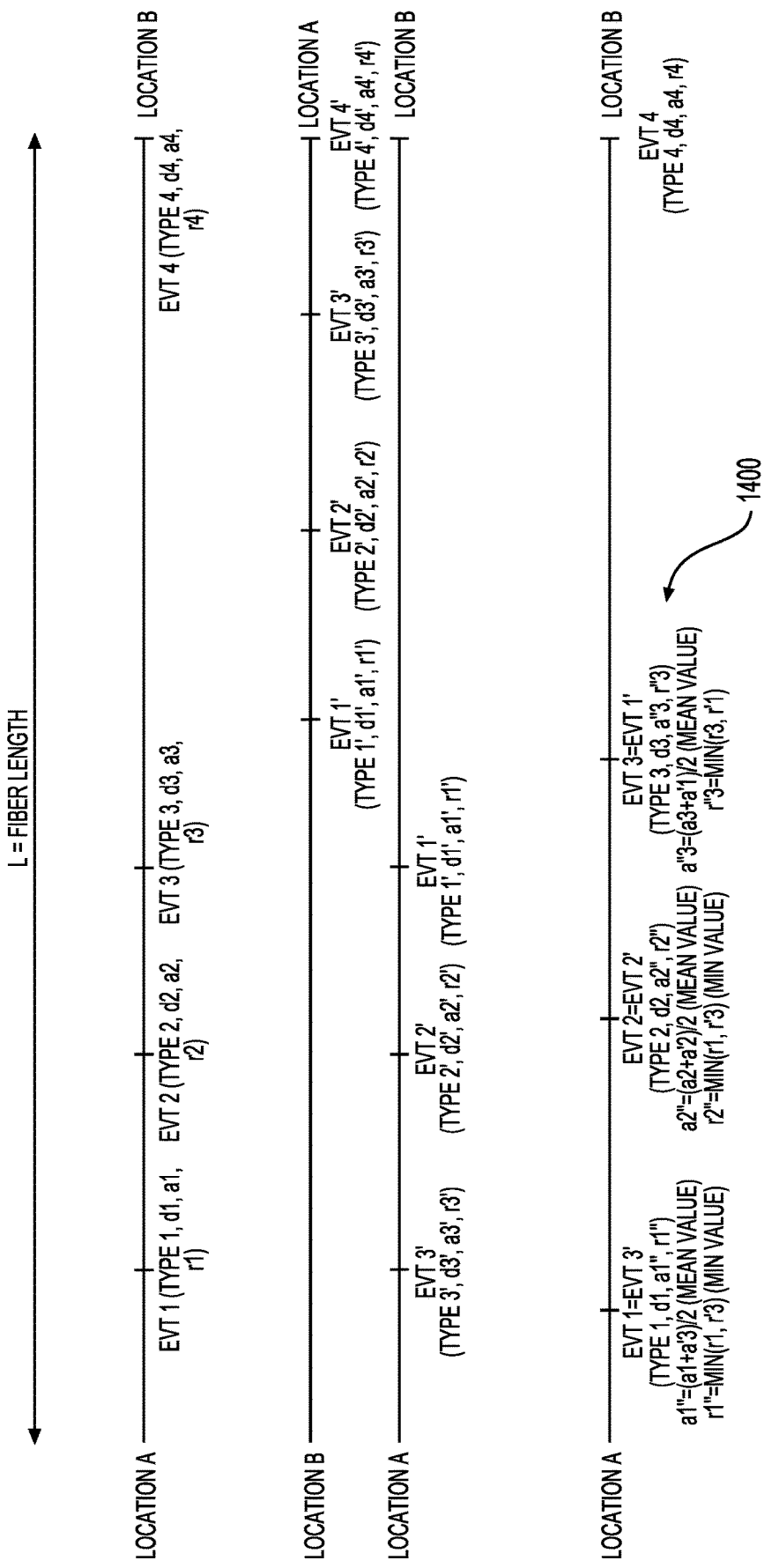
FIG. 14 illustrates optical event parameter determination by the OTDR device of FIG. 1, according to an example of the present disclosure.

FIG. 14 illustrates optical event parameter determination by the OTDR device 100, according to an example of the present disclosure.

Referring to FIG. 14, considering than two given optical events are the same, optical attenuation value may be determined as the mean value, optical reflectance may be determined as the highest reflectance, and optical distance may represent the local distance. For example, since events #1, #2, and #3 are the same as events #3', #2', and #1', as shown at 1400, optical attenuation value may be determined as the mean value, optical reflectance may be determined as the highest reflectance, and optical distance may represent the local distance.

Referring next to FIGS. 15-19, a point to point use case is described.

Figure 15:
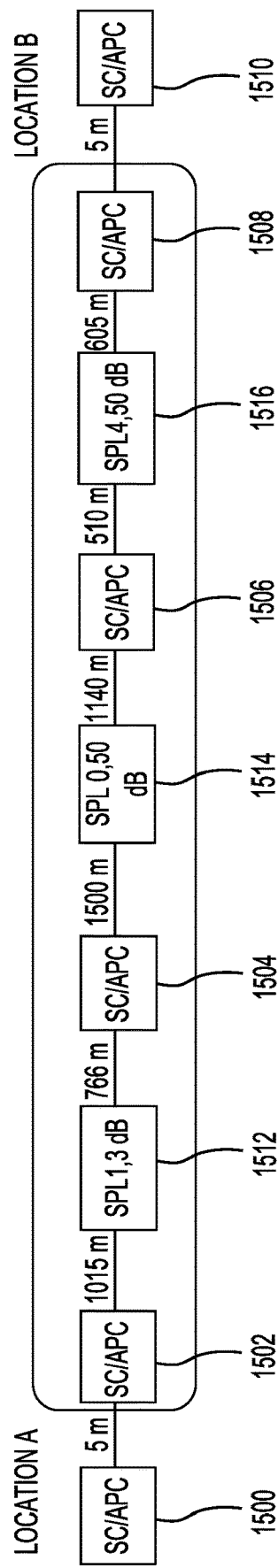
FIG. 15 illustrates a point to point configuration with multiple splices and connectors between location-A and location-B, for analysis using the OTDR device of FIG. 1, according to an example of the present disclosure.

FIG. 15 illustrates a point to point configuration with multiple splices and connectors between location-A and location-B, for analysis using the OTDR device 100, according to an example of the present disclosure.

Referring to FIG. 15, the point to point configuration may include multiple connectors (e.g., at 1500, 1502, 1504, 1506, 1508, and 1510), and splices (e.g., at 1512, 1514, and 1516) between location-A and location-B.

Figure 16:
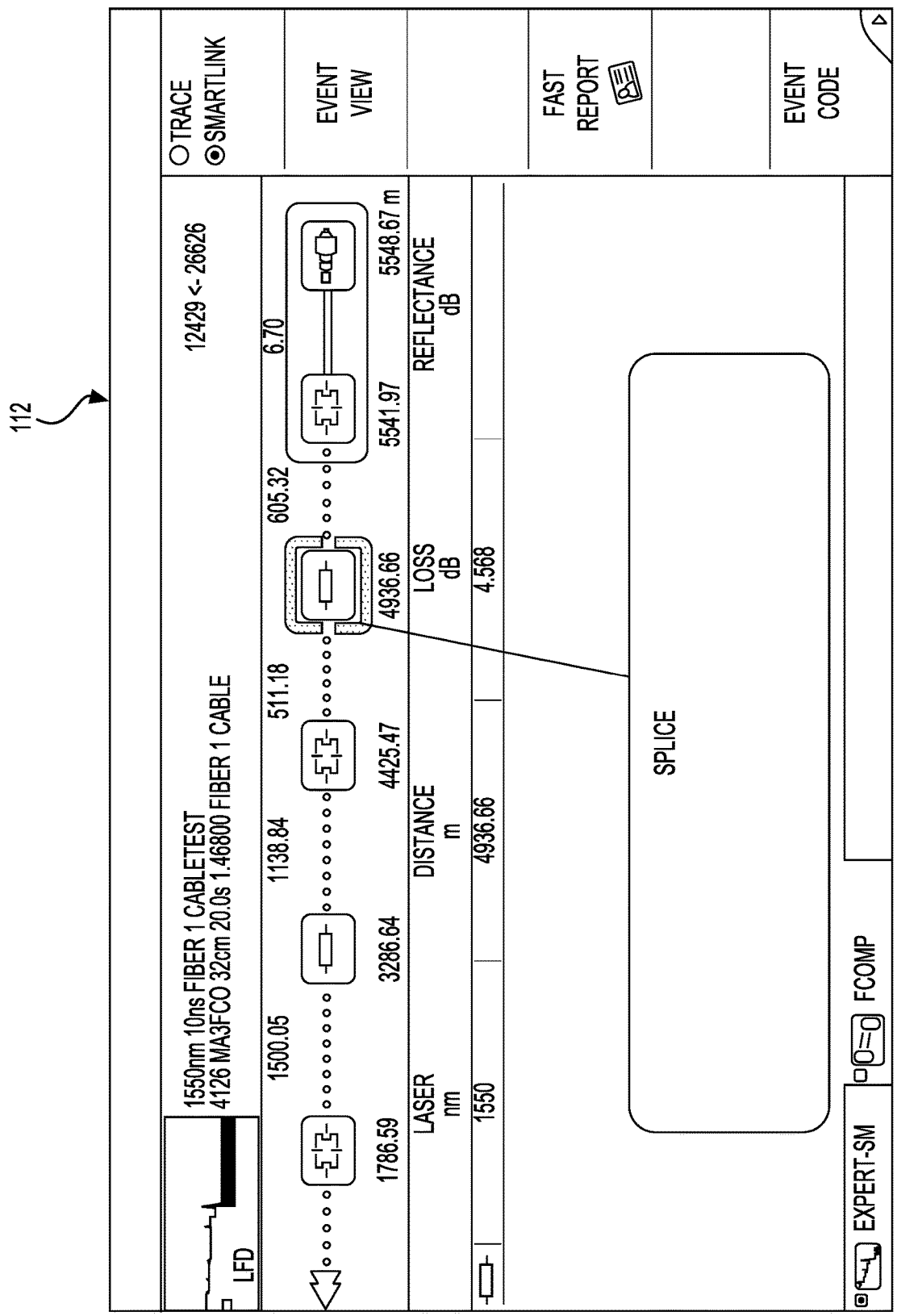
FIG. 16 illustrates a sensor display including OTDR results determined from location-A for the configuration of FIG. 15, using the OTDR device of FIG. 1, according to an example of the present disclosure.

FIG. 16 illustrates a sensor display including OTDR results determined from location-A for the configuration of FIG. 15, using the OTDR device 100, according to an example of the present disclosure.

Referring to FIG. 16, the sensor display 112 shows all optical events that have been detected and/or measured from location-A to location-B, for example, for the ORDR device at location-A. For example, for the splice at 4936.66 m, the IL may be specified as 4.568 dB.

Figure 17:
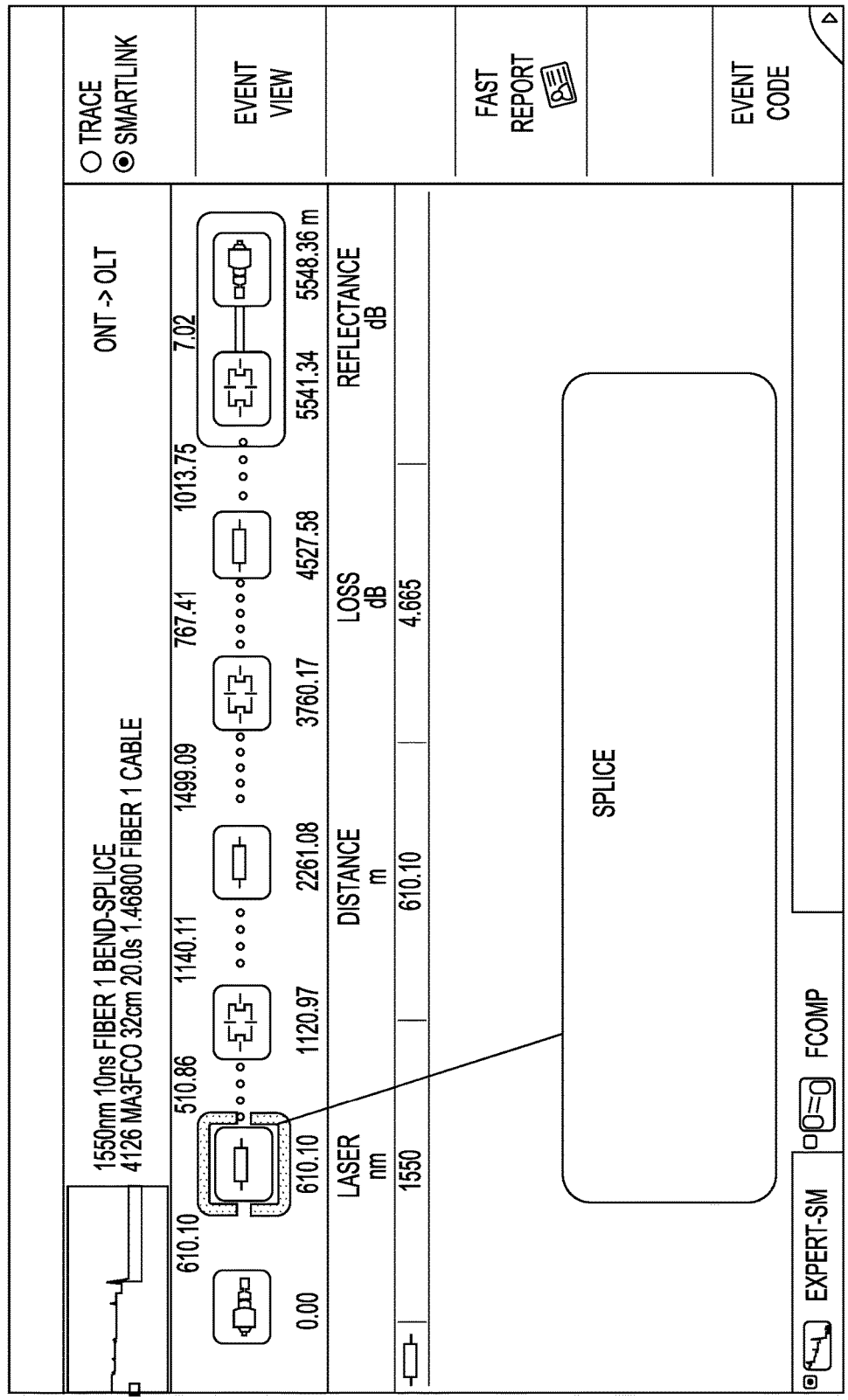
FIG. 17 illustrates a sensor display including OTDR results determined from location-B for the configuration of FIG. 15, using the OTDR device of FIG. 1, according to an example of the present disclosure.

FIG. 17 illustrates a sensor display including OTDR results determined from location-B for the configuration of FIG. 15, using the OTDR device 100, according to an example of the present disclosure.

Referring to FIG. 17, the sensor display 112 shows all optical events that have been detected and/or measured from location-B to location-A, for example, for the ORDR device at location-B. For example, the splice shown in FIG. 16 at 4936.66 m is shown at 610.10 m (e.g., when viewed from location-B), and includes an IL specified as 4.665 dB.

Figure 18:
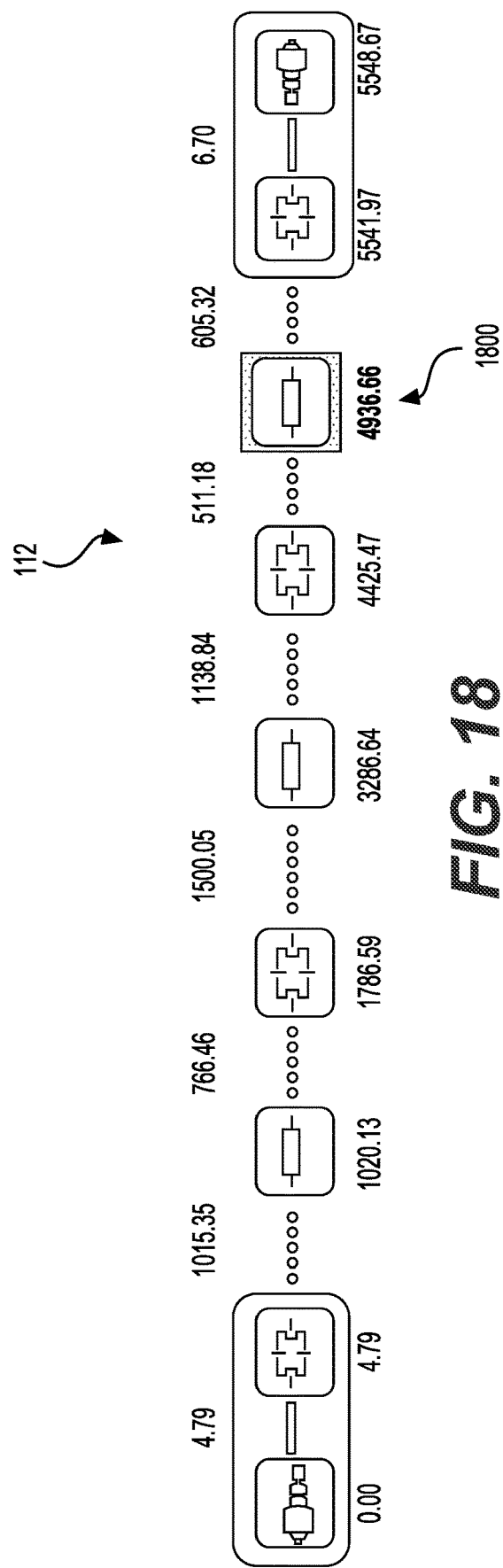
FIG. 18 illustrates a sensor display including a bi-directional combined schematic display of optical events detected and measured from location-A and location-B for the point to point configuration of FIG. 15, where the bi-directional combined schematic display is generated using the sensor displays of FIGS. 16 and 17, and using the OTDR device of FIG. 1, according to an example of the present disclosure.

FIG. 18 illustrates a sensor display including a bi-directional combined schematic display of optical events detected and measured from location-A and location-B for the point to point configuration of FIG. 15, where the bi-directional combined schematic display is generated using the sensor displays of FIGS. 16 and 17, and using the OTDR device 100, according to an example of the present disclosure.

Referring to FIG. 18, the sensor display generator 110 (e.g., for the OTDR device at location-A) may combine both optical measurement results for FIGS. 16 and 17 to generate the sensor display 112 of FIG. 18, which may include a bi-directional combined schematic display with optical events detected and/or measured from both sides of the optical fiber 106. In this regard, the bi-directional combined schematic display with optical events detected and/or measured from both sides of the optical fiber 106 may include parameters such as average value for attenuation, a worst reflectance (e.g., highest reflectance), both distances or the distance measured from a local device (e.g., the OTDR at location-A). For example, the splice shown in FIG. 16 at 4936.66 m is shown again in FIG. 18 at 1800.

Figure 19:
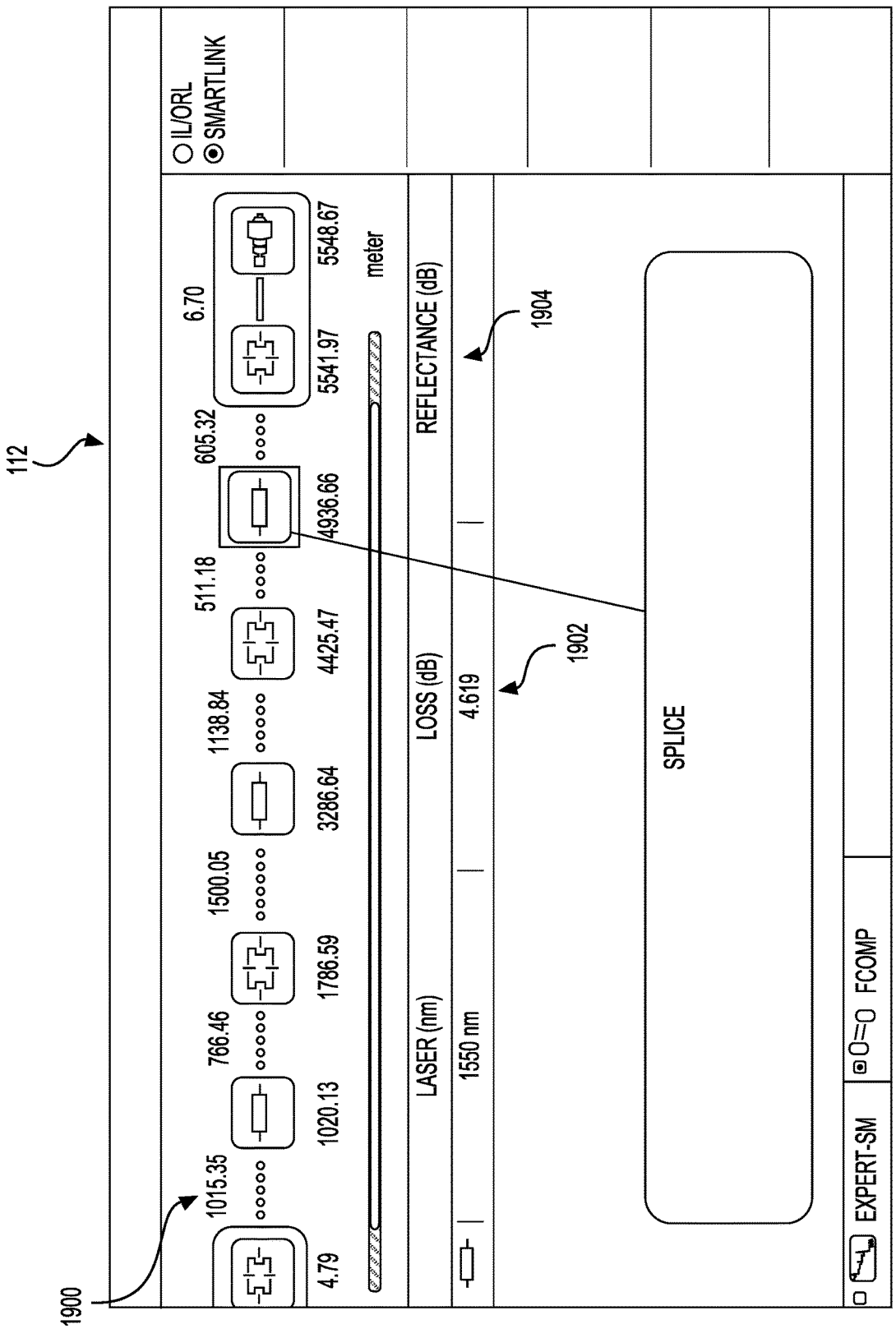
FIG. 19 illustrates a sensor display of fiber characterization results on an OTDR device where acquisition has been started for the point to point configuration of FIG. 15 and the sensor displays of FIGS. 16 and 17, determined using the OTDR device of FIG. 1, according to an example of the present disclosure.

FIG. 19 illustrates a sensor display of fiber characterization results on an OTDR device where acquisition has been started for the point to point configuration of FIG. 15 and the sensor displays of FIGS. 16 and 17, determined using the OTDR device 100, according to an example of the present disclosure.

Referring to FIG. 19, based on the exchange of measurement results over the optical fiber 106, the sensor display generator 110 (e.g., of the OTDR device at location-A) may implement the bi-directional combined schematic process to generate the sensor display 112 of the fiber characterization results, on the device where the acquisition has been started. In this regard, the sensor display 112 of FIG. 19 may be displayed in addition to or in place of the sensor display 112 of FIG. 18. The sensor display 112 of FIG. 19 may include OTDR results that include distance at 1900, attenuation at 1902, and reflectance at 1904 associated with each optical event. With respect to FIG. 19, the reflectance at 1904 is not shown because the reflectance parameter is not available for a splice as the splice may represent a non-reflective optical event. For example, for the splice shown in FIG. 16 at 4936.66 m, the average IL of 4.619 dB at 1902 is based on the IL from FIG. 16 of 4.568 dB and the IL from FIG. 17 of 4.665 dB.

Referring next to FIGS. 20-25, a point to multiple points use case is described.

Figure 20:
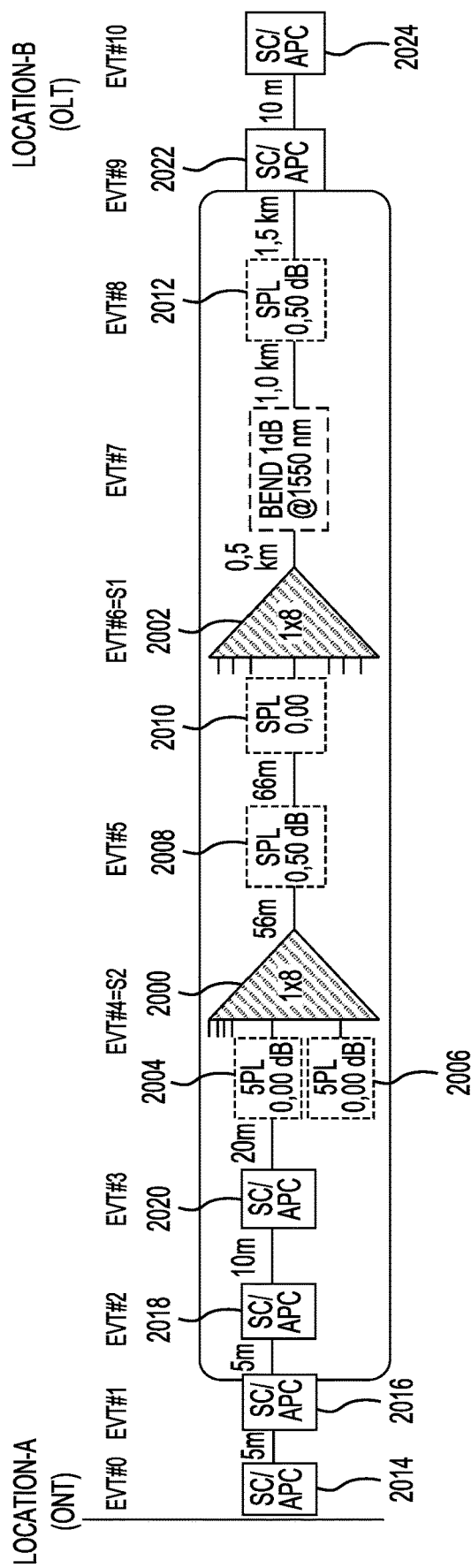
FIG. 20 illustrates a PON configuration including splitters (e.g., "1×8" splitters), for analysis using the OTDR device of FIG. 1, according to an example of the present disclosure.

FIG. 20 illustrates a PON configuration including splitters (e.g., "1×8" splitters), for analysis using the OTDR device 100, according to an example of the present disclosure.

Referring to FIG. 20, the PON configuration including splitters may include two "1×8" splitters at 2000 and 2002. Further, the PON configuration may include multiple splices (e.g., at 2004, 2006, 2008, 2010, and 2012), and connectors (e.g., at 2014, 2016, 2018, 2020, 2022, and 2024) between location-A (e.g., ONT) and location-B (e.g., OLT).

Figure 21:
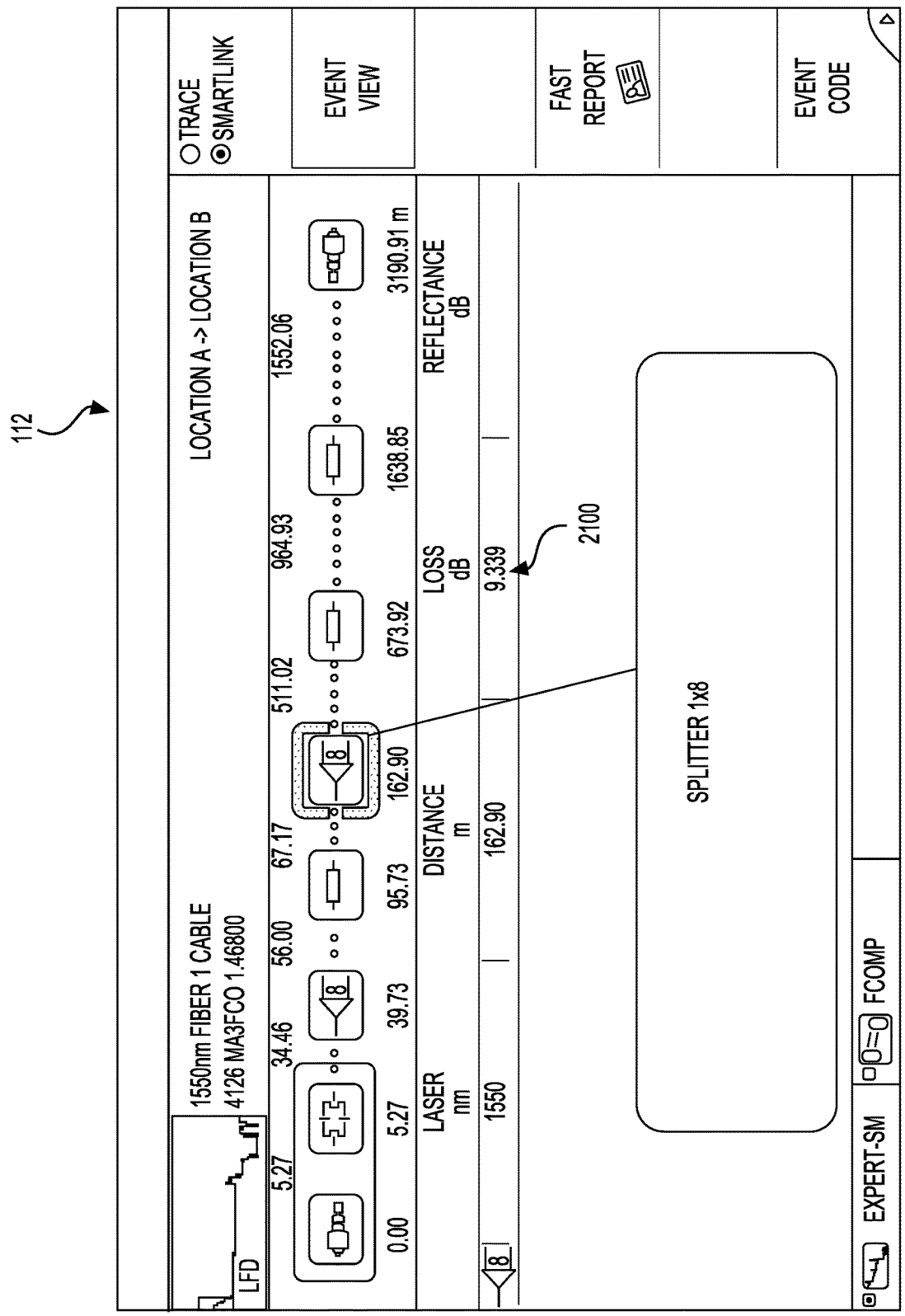
FIG. 21 illustrates a sensor display including OTDR results from an ONT for the configuration of FIG. 20, using the OTDR device of FIG. 1, according to an example of the present disclosure.

FIG. 21 illustrates a sensor display including OTDR results from an ONT for the configuration of FIG. 20, using the OTDR device 100, according to an example of the present disclosure.

Referring to FIG. 21, most of the optical events may be detected and/or measured, except the last optical event (e.g., event #9 of FIG. 20). Moreover, event #6, splitter S1 is shown to include an IL of 9.339 dB at 2100.

Figure 22:
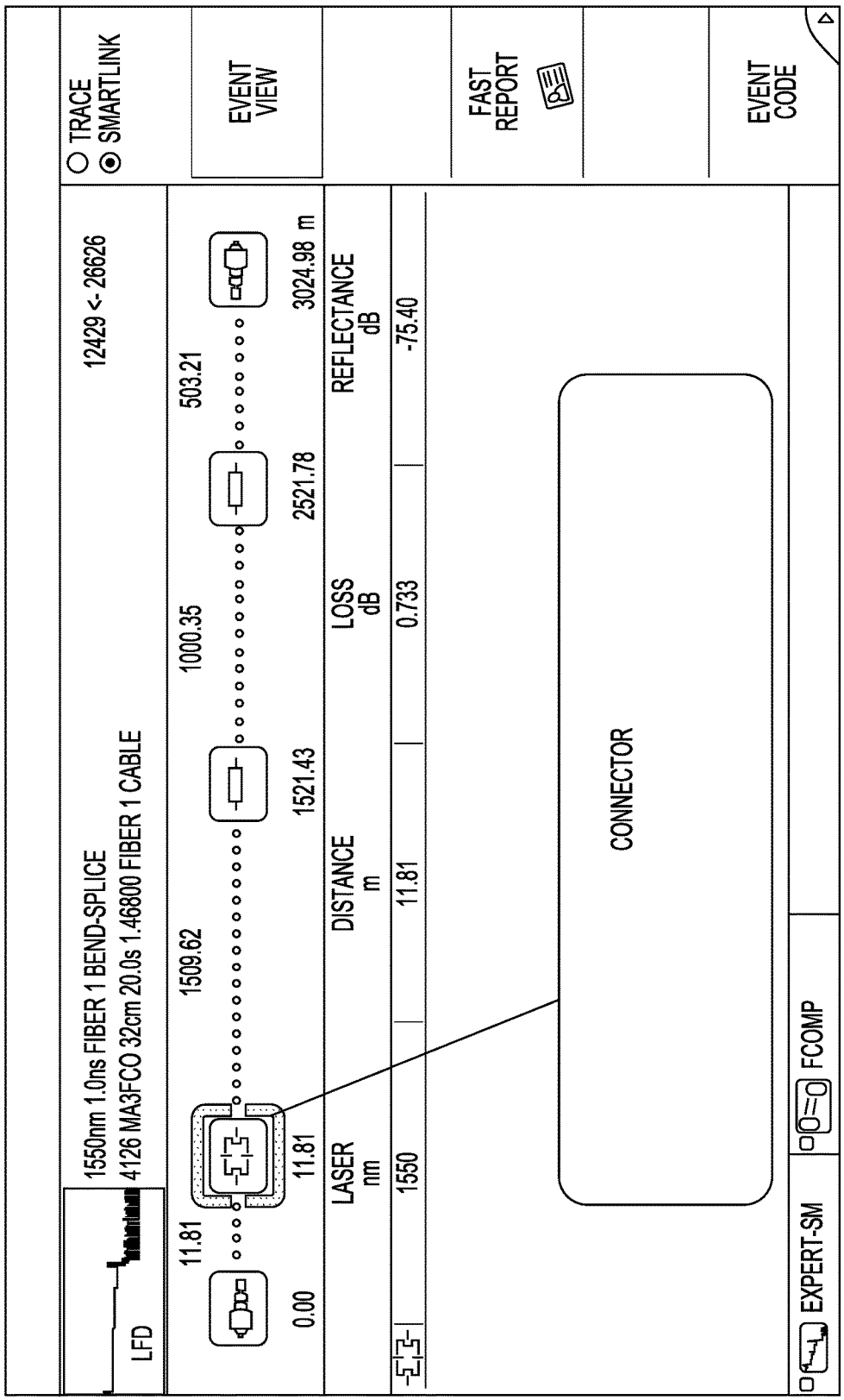
FIG. 22 illustrates a sensor display including OTDR results from an OLT for the configuration of FIG. 20, using the OTDR device of FIG. 1, according to an example of the present disclosure.

FIG. 22 illustrates a sensor display including OTDR results from an OLT for the configuration of FIG. 20, using the OTDR device 100, according to an example of the present disclosure.

Referring to FIGS. 20 and 22, the optical events before the first 1×8 splitter (S1) at 2002 may be detected and/or measured (e.g., events #7, #8, and #9 in FIG. 20). According to the dynamic of the pulse width used, the first splitter may be detected and/or measured as an 'end of fiber' optical event.

Figure 23:
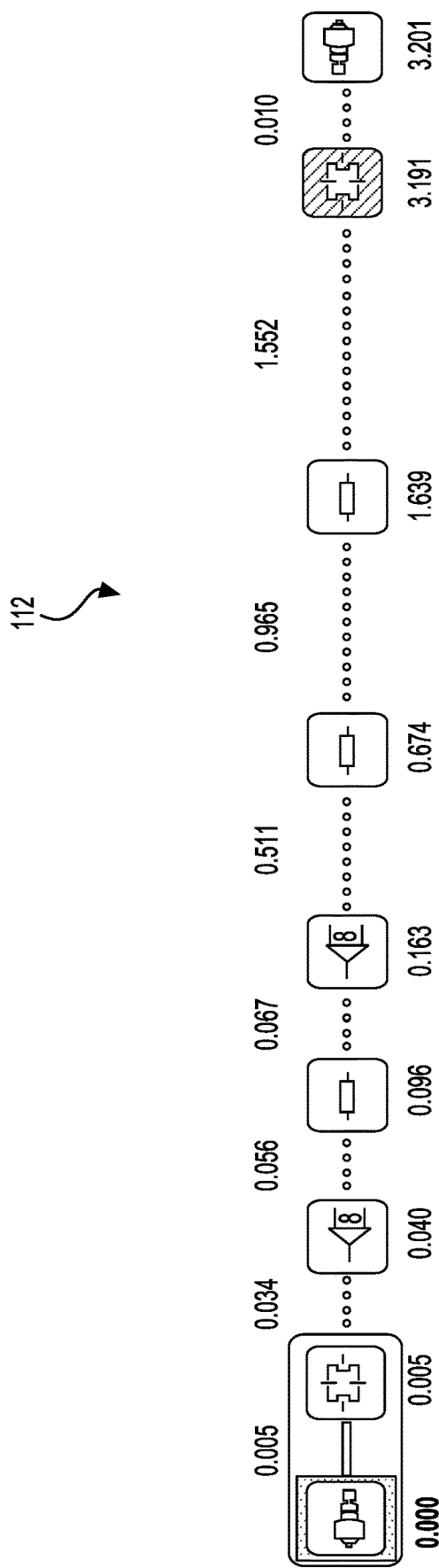
FIG. 23 illustrates a sensor display including a bi-directional combined schematic display of optical events detected and measured for the PON configuration of FIG. 20, where the bi-directional combined schematic display is generated using the sensor displays of FIGS. 21 and 22, and using the OTDR device of FIG. 1, according to an example of the present disclosure.

FIG. 23 illustrates a sensor display including a bi-directional combined schematic display of optical events detected and measured for the PON configuration of FIG. 20, where the bi-directional combined schematic display is generated using the sensor displays of FIGS. 21 and 22, and using the OTDR device 100, according to an example of the present disclosure.

Referring to FIG. 23, the sensor display generator 110 (e.g., for the OTDR device at location-A) may combine both optical measurement results for FIGS. 21 and 22 to generate the sensor display 112 of FIG. 23, which may include a bi-directional combined schematic display with optical events detected and/or measured from both sides of the optical fiber 106.

Figure 24:
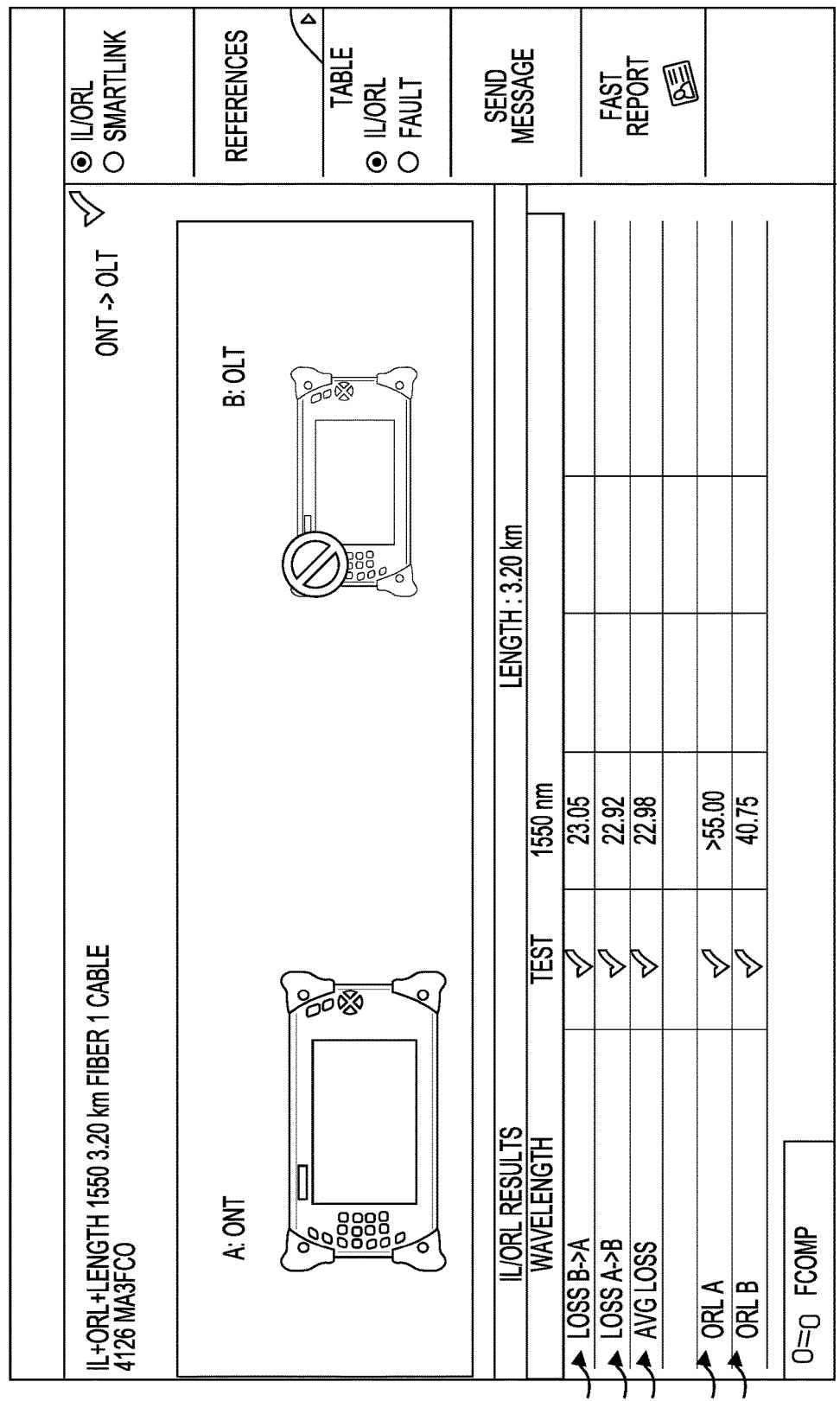
FIG. 24 illustrates a sensor display of IL and ORL bi-directional results and fiber length measurement for the PON configuration of FIG. 20 and the sensor displays of FIGS. 21 and 22, determined using the OTDR device of FIG. 1, according to an example of the present disclosure.

FIG. 24 illustrates a sensor display of IL and ORL bi-directional results and fiber length measurement for the PON configuration of FIG. 20 and the sensor displays of FIGS. 21 and 22, determined using the OTDR device 100, according to an example of the present disclosure.

Referring to FIG. 24, based on the exchange of measurement results over the optical fiber 106, the sensor display generator 110 (e.g., of the OTDR device at location-A) may implement the bi-directional combined schematic process to generate the sensor display 112 of the fiber characterization results, on the device where the acquisition has been started (e.g., the OTDR device at location-A). In this regard, the sensor display 112 of FIG. 24 may be displayed in addition to or in place of the sensor display 112 of FIG. 23. Moreover, IL from location-B to location-A is displayed at 2400, IL from location-A to location-B is displayed at 2402, and average IL is displayed at 2404. Further, OCWR-ORL from location-A to location-B is displayed at 2406, and OCWR-ORL from location-B to location-A is displayed at 2408.

Figure 25:
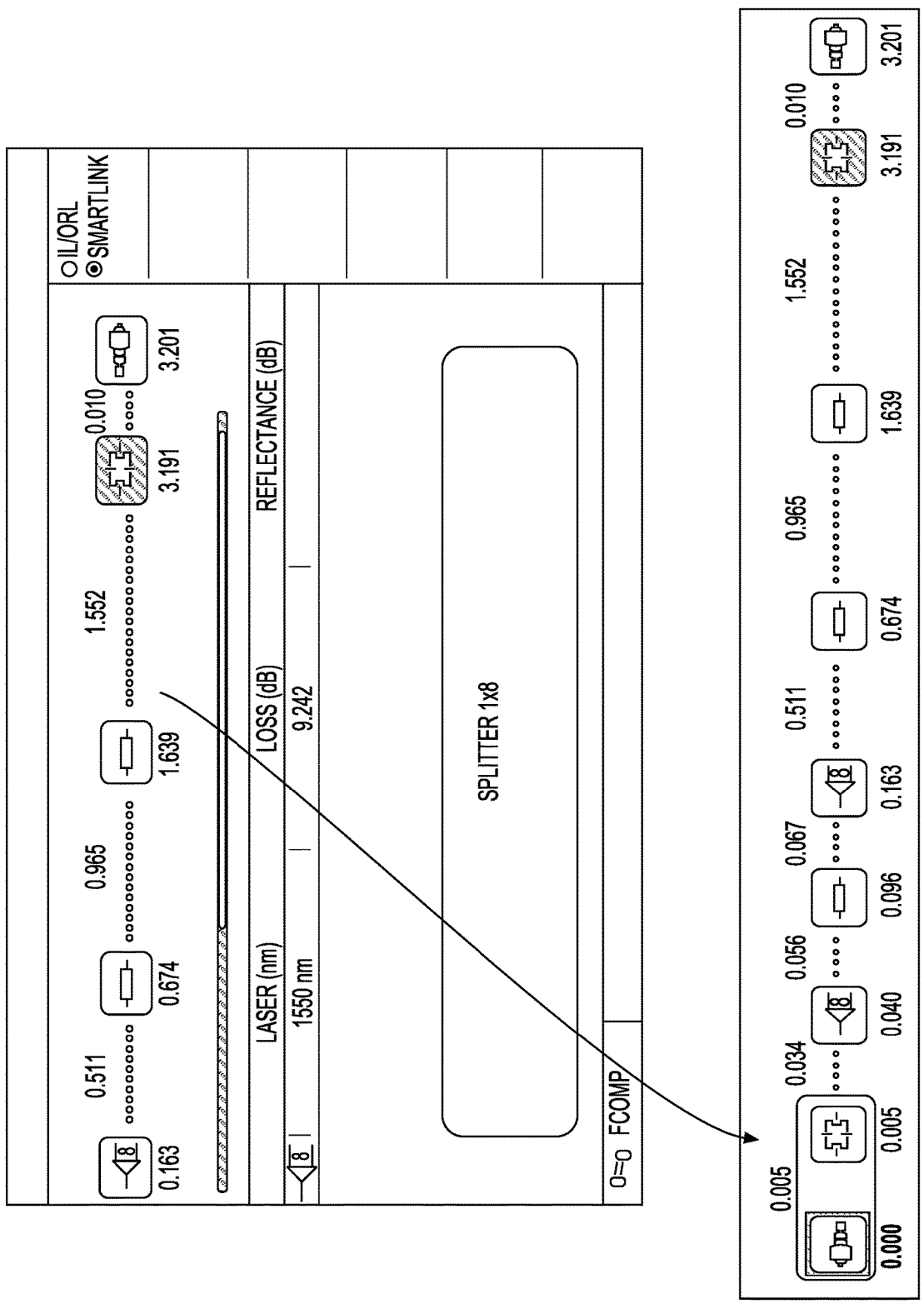
FIG. 25 illustrates a bi-directional combined schematic display (with additional optical events determined from OLT to ONT OTDR acquisition) for the PON configuration of FIG. 20 and the sensor displays of FIGS. 21 and 22, determined using the OTDR device of FIG. 1, according to an example of the present disclosure.

FIG. 25 illustrates a bi-directional combined schematic display (with additional optical events determined from OLT to ONT OTDR acquisition) for the PON configuration of FIG. 20 and the sensor displays of FIGS. 21 and 22, determined using the OTDR device 100, according to an example of the present disclosure. FIG. 25 shows similar information as shown in FIG. 23, but with further details associated with each optical event.

Referring next to FIGS. 26-29, another point to point use case is described.

Figure 26:
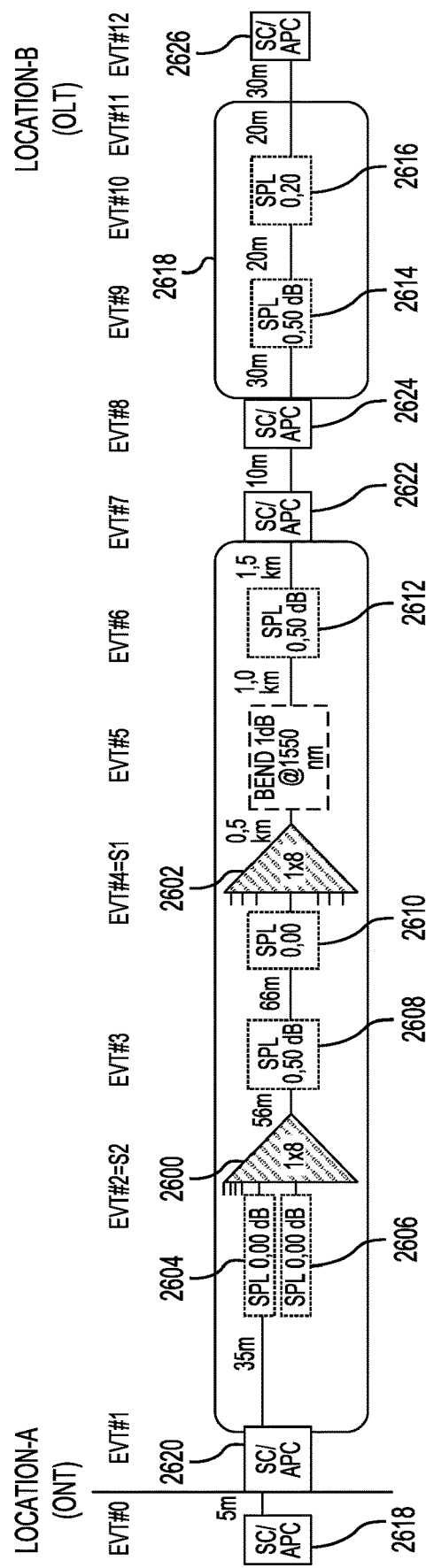
FIG. 26 illustrates a PON configuration including splitters (e.g., "1×8" splitters) and a plurality of splices on a 'feeder' section, for analysis using the OTDR device of FIG. 1, according to an example of the present disclosure.

FIG. 26 illustrates a PON configuration including splitters (e.g., "1×8" splitters) and a plurality of splices on a 'feeder' section, for analysis using the OTDR device 100, according to an example of the present disclosure.

Referring to FIG. 26, the PON configuration including splitters may include two "1×8" splitters at 2600 and 2602.

Further, the PON configuration may include multiple splices (e.g., at 2604, 2606, 2608, 2610, 2612, 2614, and 2616) between location-A (e.g., ONT) and location-B (e.g., OLT). Connectors may be disposed at 2618, 2620, 2622, 2624, and 2626.

Figure 27:
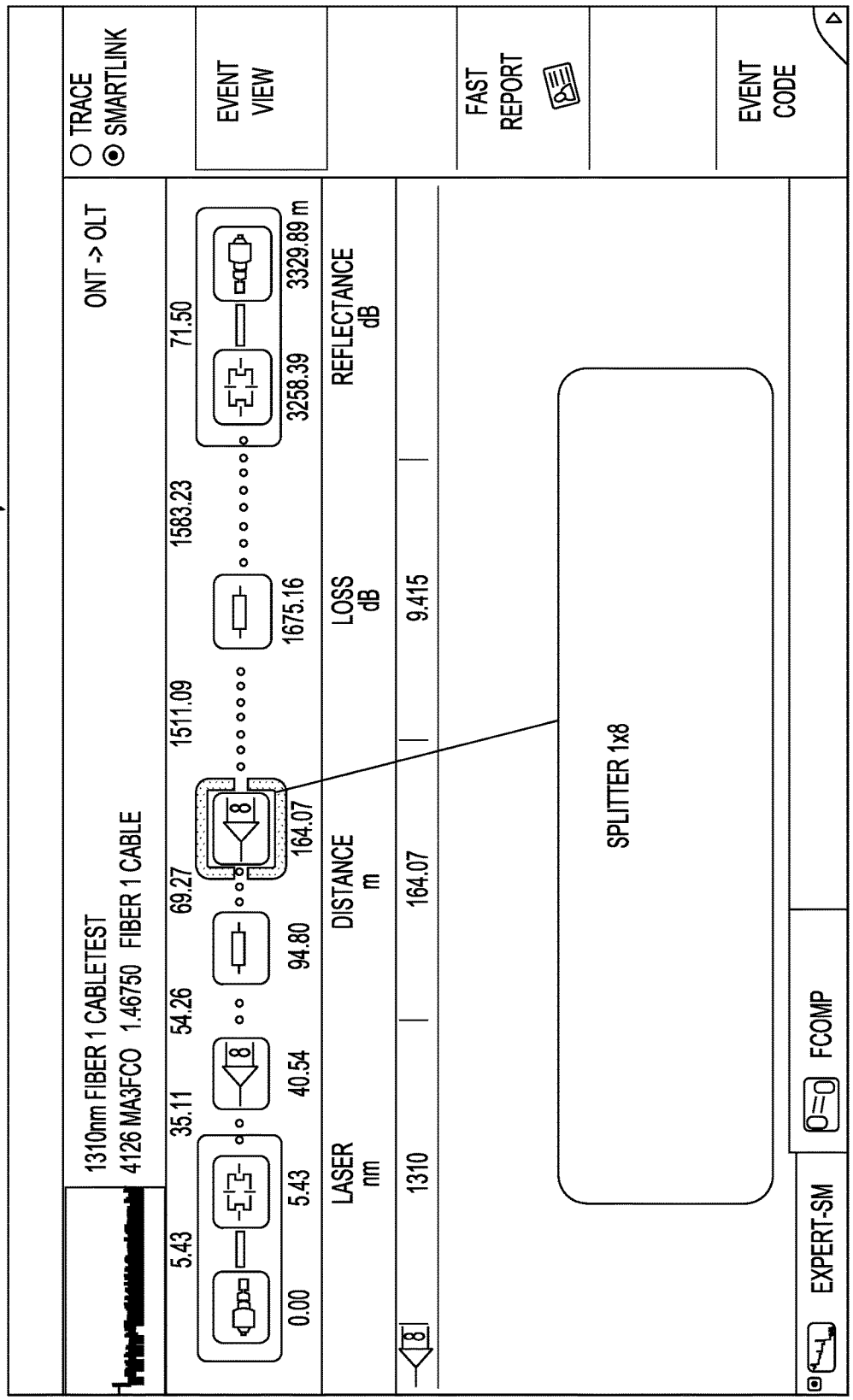
FIG. 27 illustrates a sensor display including OTDR results from an ONT to an OLT for the configuration of FIG. 26, using the OTDR device of FIG. 1, according to an example of the present disclosure.

FIG. 27 illustrates a sensor display including OTDR results from an ONT for the configuration of FIG. 26, using the OTDR device 100, according to an example of the present disclosure.

Referring to FIG. 27, most of the optical events after the 1×8 splitter (S1) at 2602 may not be detected (e.g., all events except the event identified at 2612 are not detected).

Figure 28:
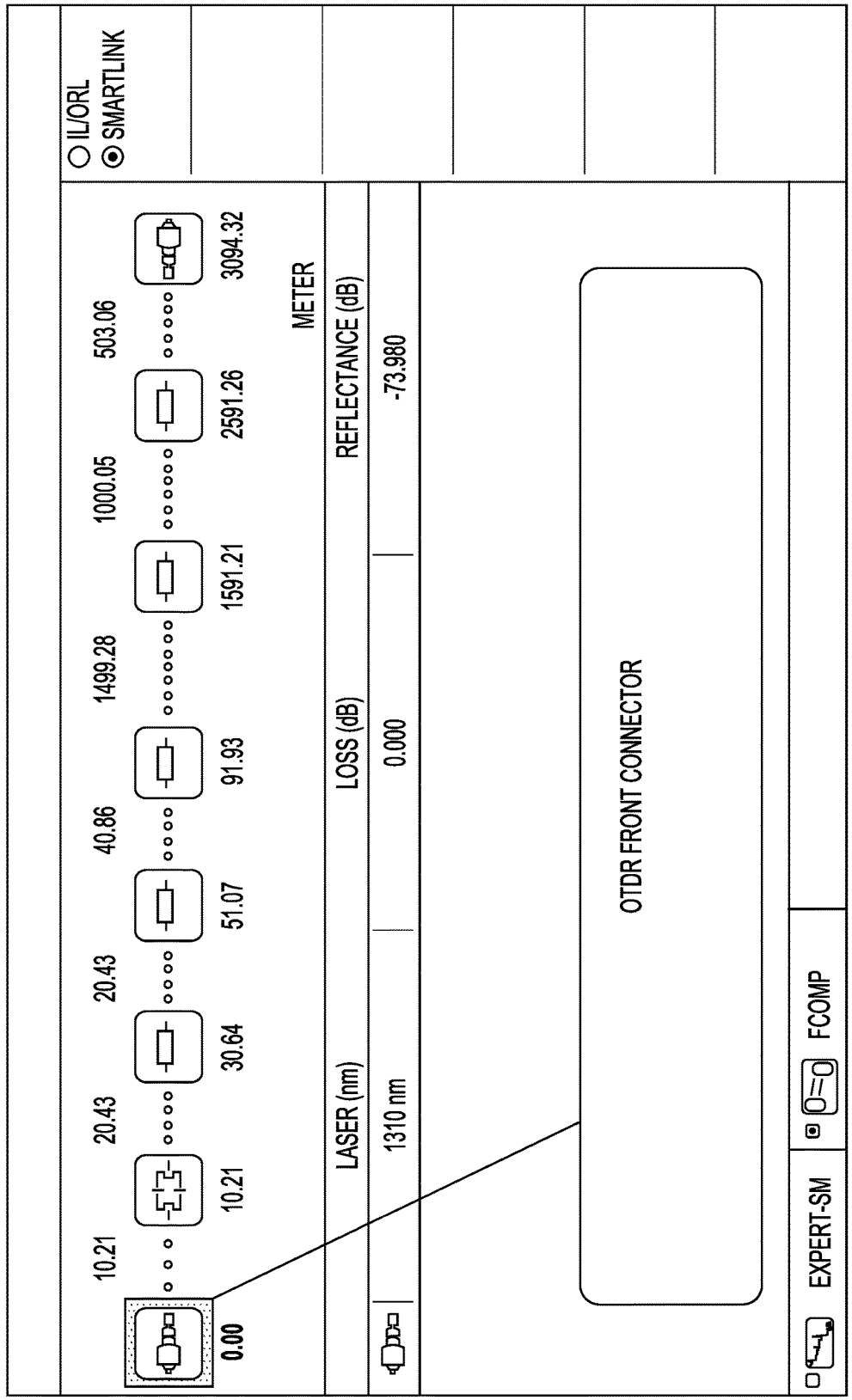
FIG. 28 illustrates a sensor display including OTDR results from an OLT to an ONT for the configuration of FIG. 26, using the OTDR device of FIG. 1, according to an example of the present disclosure.

FIG. 28 illustrates a sensor display including OTDR results from an OLT for the configuration of FIG. 26, using the OTDR device 100, according to an example of the present disclosure.

Referring to FIG. 28, the optical events before the first 1×8 splitter (S1) at 2602 may be detected and/or measured. For example, events #5, #6, #7, #8, #10, and #11 may be correctly detected and/or measured. Further, according to the dynamic of the pulse width used, the first splitter at 2602 may be detected and/or measured as an 'end of fiber' optical event, and may not be sent to the local OTDR device at the ONT.

Figure 29:
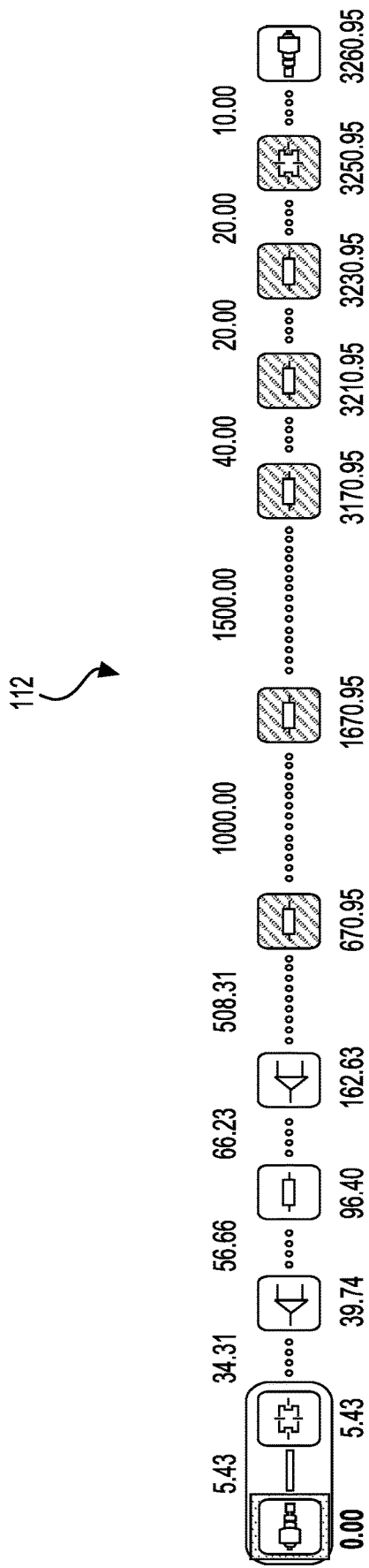
FIG. 29 illustrates a sensor display including a bi-directional combined schematic display of optical events detected and measured for the PON configuration of FIG. 26, where the bi-directional combined schematic display is generated using the sensor displays of FIGS. 27 and 28, and using the OTDR device of FIG. 1, according to an example of the present disclosure.

FIG. 29 illustrates a sensor display including a bi-directional combined schematic display of optical events detected and measured for the PON configuration of FIG. 26, where the bi-directional combined schematic display is generated using the sensor displays of FIGS. 27 and 28, and using the OTDR device 100, according to an example of the present disclosure.

Referring to FIG. 29, the sensor display generator 110 (e.g., for the OTDR device at location-A) may combine both optical measurement results for FIGS. 27 and 28 to generate the sensor display 112 of FIG. 29, which may include a bi-directional combined schematic display with optical events detected and/or measured from both sides of the optical fiber 106.

Figure 30:
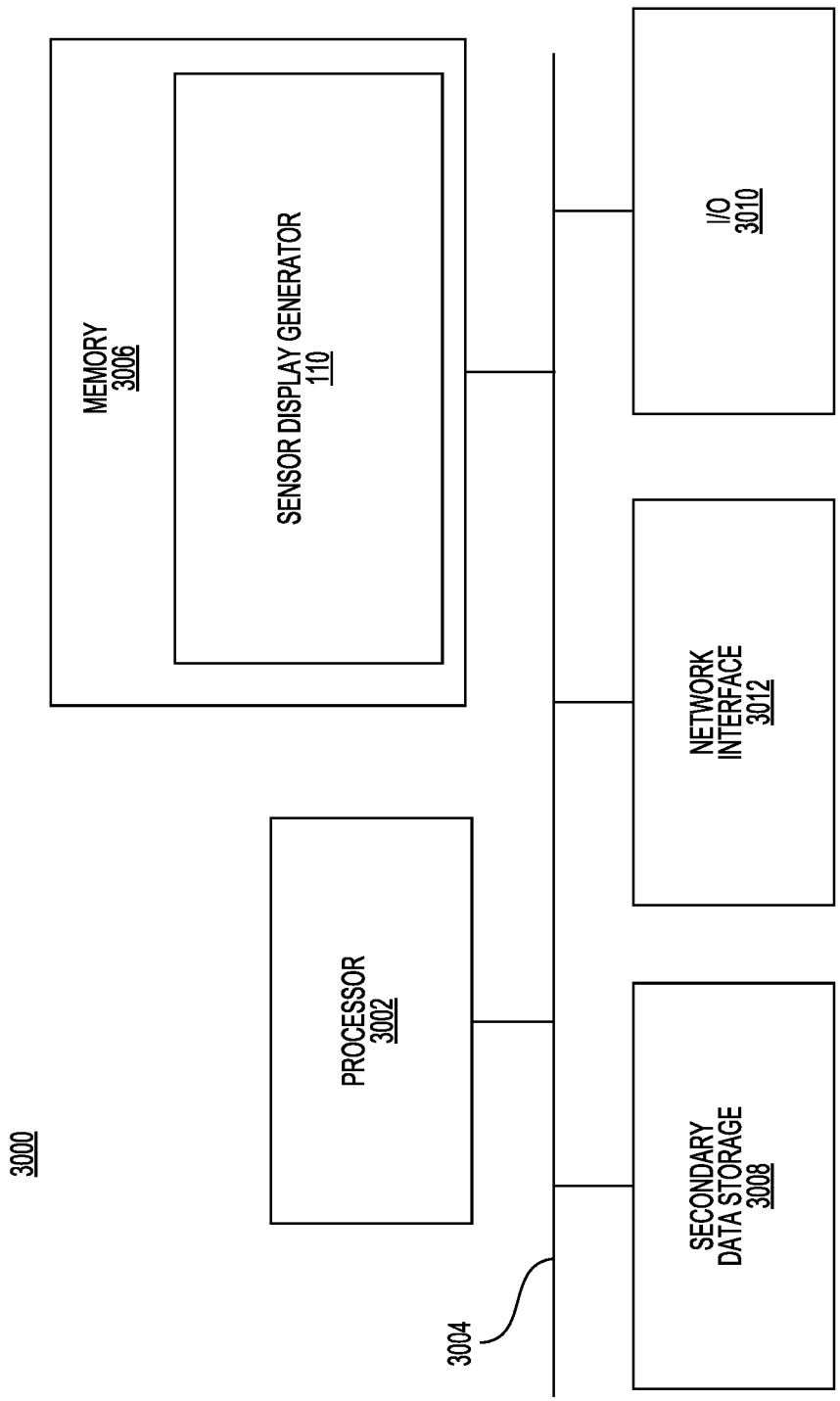
FIG. 30 illustrates a computer system, according to an example of the present disclosure.

FIG. 30 shows a computer system 3000 that may be used with the examples described herein. The computer system may represent a generic platform that includes components that may be in a server or another computer system. The computer system 3000 may be used as part of a platform for the sensor display generator 110. The computer system 3000 may execute, by a processor (e.g., a single or multiple processors) or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 3000 may include a processor 3002 that may implement or execute machine readable instructions performing some or all of the methods, functions and other processes described herein. Commands and data from the processor 3002 may be communicated over a communication bus 3004. The computer system may also include a main memory 3006, such as a random access memory (RAM), where the machine readable instructions and data for the processor 3002 may reside during runtime, and a secondary data storage 3008, which may be non-volatile and stores machine readable instructions and data. The memory and data storage are examples of computer readable mediums. The memory 3006 may include the sensor display generator 110 including machine readable instructions residing in the memory 3006 during runtime and executed by the processor 3002.

The computer system 3000 may include an I/O device 3010, such as a keyboard, a mouse, a display, etc. The computer system may include a network interface 3012 for connecting to a network. Other known electronic components may be added or substituted in the computer system.

The processor 3002 may be designated as a hardware processor. The processor 3002 may execute operations associated with various components of the OTDR device 100. For example, the processor 3002 may execute operations associated with the sensor display generator 110, etc.

According to examples disclosed herein, the processor 3002 may execute operations associated with the sensor display generator 110 to emit, by a laser source of the OTDR device 100, a laser beam into a DUT (e.g., the optical fiber 106). The OTDR device 100 may include a connection port to connect the OTDR device 100 to a first end of the DUT, where the OTDR device 100 may be designated a first OTDR device. The sensor display generator 110 may determine, based on the laser beam, a length of the DUT. Further, the sensor display generator 110 may receive, from a second OTDR device connectable to a second opposite end of the DUT, and over the DUT, OTDR information acquired by the second OTDR device, where the OTDR information may include an identification of optical events with respect to the DUT in a direction from the second OTDR device towards the first OTDR device. Further, the sensor display generator 110 may ascertain, based on acquisition by the first OTDR device, further OTDR information that includes an identification of optical events with respect to the DUT in a direction from the first OTDR device towards the second OTDR device. The sensor display generator 110 may generate, based on the determined length of the DUT, the OTDR information received, over the DUT, by the first OTDR device, and the further OTDR information acquired by the first OTDR device, a bi-directional combined schematic display that includes relevant optical events with respect to the DUT.

According to examples disclosed herein, the sensor display generator 110 may generate the bi-directional combined schematic display that includes the relevant optical events with respect to the DUT by receiving, from the second OTDR device and over the DUT, a first set of OTDR optical event parameters for each optical event identified in the OTDR information that includes the identification of the optical events with respect to the DUT in the direction from the second OTDR device towards the first OTDR device, where the first set of OTDR optical event parameters may include position, attenuation, reflectance, and/or optical event type associated with the optical events identified by the second OTDR device. The sensor display generator 110 may ascertain, based on acquisition by the first OTDR device, a second set of OTDR optical event parameters for each optical event identified in the further OTDR information that includes the identification of the optical events with respect to the DUT in the direction from the first OTDR device towards the second OTDR device, where the second set of OTDR optical event parameters may include position, attenuation, reflectance, and/or optical event type associated with the optical events identified by the first OTDR device. The sensor display generator 110 may receive, from the second OTDR device and over the DUT, a first set of OTDR acquisition parameters associated with the OTDR information that includes the identification of the optical events with respect to the DUT in the direction from the second OTDR device towards the first OTDR device, where the first set of OTDR acquisition parameters may include pulse width and/or resolution used during acquisition by the second OTDR device. The sensor display generator 110 may ascertain, based on determination by the first OTDR device, a second set of OTDR acquisition parameters associated with the further OTDR information that includes the identification of the optical events with respect to the DUT in the direction from the first OTDR device towards the second OTDR device, where the second set of OTDR acquisition parameters may include pulse width and/or resolution used during the acquisition by the first OTDR device. The sensor display generator 110 may generate, based on the determined length of the DUT, the OTDR information, the first set of OTDR optical event parameters, and the first set of OTDR acquisition parameters received, over the DUT, by the first OTDR device, and the further OTDR information acquired by the first OTDR device, the second set of OTDR optical event parameters acquired by the first OTDR device, and the second set of OTDR acquisition parameters determined by the first OTDR device, the bi-directional combined schematic display that includes the relevant optical events with respect to the DUT.

According to examples disclosed herein, the sensor display generator 110 may ascertain an IL measurement determined by the first OTDR device with respect to the DUT in the direction from the first OTDR device towards the second OTDR device. Further, the sensor display generator 110 may receive, from the second OTDR device and over the DUT, IL measurement determined by the second OTDR device with respect to the DUT in the direction from the second OTDR device towards the first OTDR device. The sensor display generator 110 may generate the bi-directional combined schematic display to include the IL measurement determined by the first OTDR device with respect to the DUT in the direction from the first OTDR device towards the second OTDR device, and the IL measurement received, over the DUT, from the second OTDR device.

According to examples disclosed herein, the sensor display generator 110 may generate the bi-directional combined schematic display by determining, based on the IL measurement determined by the first OTDR device with respect to the DUT in the direction from the first OTDR device towards the second OTDR device, and the IL measurement received, over the DUT, from the second OTDR device, an average IL measurement for the DUT. Further, the sensor display generator 110 may generate the bi-directional combined schematic display to include the average IL measurement for the DUT.

According to examples disclosed herein, the sensor display generator 110 may ascertain an OCWR-ORL measurement determined by the first OTDR device with respect to the DUT in the direction from the first OTDR device towards the second OTDR device. Further, the sensor display generator 110 may receive, from the second OTDR device and over the DUT, OCWR-ORL measurement determined by the second OTDR device with respect to the DUT in the direction from the second OTDR device towards the first OTDR device. The sensor display generator 110 may generate the bi-directional combined schematic display to include the OCWR-ORL measurement determined by the first OTDR device with respect to the DUT in the direction from the first OTDR device towards the second OTDR device, and the OCWR-ORL measurement received, over the DUT, from the second OTDR device.

According to examples disclosed herein, the sensor display generator 110 may generate the bi-directional combined schematic display by determining, based on the OCWR-ORL measurement determined by the first OTDR device with respect to the DUT in the direction from the first OTDR device towards the second OTDR device, and the OCWR-ORL measurement received, over the DUT, from the second OTDR device, a highest OCWR-ORL measurement for the DUT. The sensor display generator 110 may generate the bi-directional combined schematic display to include an identification of the highest OCWR-ORL measurement for the DUT.

According to examples disclosed herein, the connection port may include a single connection port to perform bi-directional measurements without any optical disconnection.

According to examples disclosed herein, the optical events identified by the first and second OTDRs may correspond to a wavelength of the laser beam, and may be different from optical events that correspond to a different wavelength of the laser beam.

According to examples disclosed herein, the sensor display generator 110 may ascertain, based on acquisition by the first OTDR device, the further OTDR information that includes the identification of optical events with respect to the DUT in the direction from the first OTDR device towards the second OTDR device by ascertaining, based on acquisition by the first OTDR device without any optical disconnection from the DUT, the further OTDR information that includes the identification of optical events with respect to the DUT in the direction from the first OTDR device towards the second OTDR device.

According to examples disclosed herein, the OTDR information acquired by the first OTDR device or the OTDR information acquired by the second OTDR device may be filtered to delete an optical event based on an optical event type or an optical event position relative to a splitter.

According to examples disclosed herein, for a PON topology, the first end of the DUT may correspond to an ONT and the second end of the DUT may correspond to an OLT. The OTDR information acquired by the first OTDR device or the OTDR information acquired by the second OTDR device may be filtered to delete an optical event based on a determination of whether the optical event is an end of fiber event that is not relevant at the OLT, an optical event that is located after a specified splitter (e.g., a second splitter as disclosed herein) from the ONT, and an optical event that is located after the specified splitter, or after another specified (e.g., a first splitter as disclosed herein) splitter from the OLT.

According to examples disclosed herein, the processor 3002 may execute operations associated with the sensor display generator 110 to emit, by a laser source of the OTDR device 100, a laser beam into a DUT (e.g., the optical fiber 106). The OTDR device 100 may include a connection port to connect the OTDR device 100 to a first end of the DUT, where the OTDR device may be designated a first OTDR device. The sensor display generator 110 may determine, based on the laser beam, a length of the DUT. The sensor display generator 110 may receive, from a second OTDR device connectable to a second opposite end of the DUT, and over the DUT, OTDR information acquired by the second OTDR device. The OTDR information may include an identification of optical events with respect to the DUT in a direction from the second OTDR device towards the first OTDR device. Further, the OTDR information may be filtered to add or delete an optical event based on a quality criterion. The sensor display generator 110 may ascertain, based on acquisition by the first OTDR device, further OTDR information that includes an identification of optical events with respect to the DUT in a direction from the first OTDR device towards the second OTDR device. The sensor display generator 110 may filter the further OTDR information to add or delete the optical event based on the quality criterion. The sensor display generator 110 may generate, based on the determined length of the DUT, the OTDR information received, over the DUT, by the first OTDR device, and the further OTDR information acquired by the first OTDR device, a bi-directional combined schematic display that includes relevant optical events with respect to the DUT.

According to examples disclosed herein, the sensor display generator 110 may filter the further OTDR information to add or delete the optical event based on the quality criterion by determining that the optical event associated with the OTDR information that includes the identification of optical events with respect to the DUT in the direction from the second OTDR device towards the first OTDR device is identical to the optical event associated with the further OTDR information that includes the identification of the optical events with respect to the DUT in the direction from the first OTDR device towards the second OTDR device. Based on this determination that the optical event associated with the OTDR information that includes the identification of optical events with respect to the DUT in the direction from the second OTDR device towards the first OTDR device is identical to the optical event associated with the further OTDR information that includes the identification of the optical events with respect to the DUT in the direction from the first OTDR device towards the second OTDR device, the sensor display generator 110 may analyze the optical event to display specified optical event parameters with respect to the optical event.

According to examples disclosed herein, the specified optical event parameters may include mean value for attenuation associated with the optical event, a highest reflectance value associated with the optical event, and/or a distance from the first OTDR device.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An optical time-domain reflectometer (OTDR) device comprising:
    a laser source to emit a laser beam into a device under test (DUT);
    a connection port to connect the OTDR device to a first end of the DUT, wherein the OTDR device is designated a first OTDR device; and
    a sensor display generator, executed by at least one hardware processor, to:
        determine, based on the laser beam, a length of the DUT;
        receive, from a second OTDR device connectable to a second opposite end of the DUT, and over the DUT, OTDR information acquired by the second OTDR device, wherein the OTDR information includes an identification of optical events with respect to the DUT in a direction from the second OTDR device towards the first OTDR device;
        ascertain, based on acquisition by the first OTDR device, further OTDR information that includes an identification of optical events with respect to the DUT in a direction from the first OTDR device towards the second OTDR device; and
        generate, based on
            the determined length of the DUT,
            the OTDR information received, over the DUT, by the first OTDR device, and
            the further OTDR information acquired by the first OTDR device, a bi-directional combined schematic display that includes relevant optical events with respect to the DUT by
                determining, based on an insertion loss (IL) measurement determined by the first OTDR device with respect to the DUT in the direction from the first OTDR device towards the second OTDR device, and an IL measurement received, over the DUT, from the second OTDR device, an average IL measurement for the DUT, and
                generating the bi-directional combined schematic display to include the average IL measurement for the DUT.

2. The OTDR device according to claim 1, wherein the DUT includes an optical fiber.

3. The OTDR device according to claim 1, wherein the sensor display generator is further executed by the at least one hardware processor to generate the bi-directional combined schematic display that includes the relevant optical events with respect to the DUT by:
    receiving, from the second OTDR device and over the DUT, a first set of OTDR optical event parameters for each optical event identified in the OTDR information that includes the identification of the optical events with respect to the DUT in the direction from the second OTDR device towards the first OTDR device, wherein the first set of OTDR optical event parameters includes at least one of position, attenuation, reflectance, or optical event type associated with the optical events identified by the second OTDR device;
    ascertaining, based on acquisition by the first OTDR device, a second set of OTDR optical event parameters for each optical event identified in the further OTDR information that includes the identification of the optical events with respect to the DUT in the direction from the first OTDR device towards the second OTDR device, wherein the second set of OTDR optical event parameters includes at least one of position, attenuation, reflectance, or optical event type associated with the optical events identified by the first OTDR device;
    receiving, from the second OTDR device and over the DUT, a first set of OTDR acquisition parameters associated with the OTDR information that includes the identification of the optical events with respect to the DUT in the direction from the second OTDR device towards the first OTDR device, wherein the first set of OTDR acquisition parameters includes at least one of pulse width or resolution used during acquisition by the second OTDR device;
    ascertaining, based on determination by the first OTDR device, a second set of OTDR acquisition parameters associated with the further OTDR information that includes the identification of the optical events with respect to the DUT in the direction from the first OTDR device towards the second OTDR device, wherein the second set of OTDR acquisition parameters includes at least one of pulse width or resolution used during the acquisition by the first OTDR device; and generating, based on
- the determined length of the DUT,
- the OTDR information, the first set of OTDR optical event parameters, and the first set of OTDR acquisition parameters received, over the DUT, by the first OTDR device, and
- the further OTDR information acquired by the first OTDR device, the second set of OTDR optical event parameters acquired by the first OTDR device, and the second set of OTDR acquisition parameters determined by the first OTDR device, the bi-directional combined schematic display that includes the relevant optical events with respect to the DUT.

4. The OTDR device according to claim 1, wherein for a passive optical network (PON) topology, the first end of the DUT corresponds to an optical network terminal (ONT) and the second end of the DUT corresponds to an optical line terminal (OLT).

5. The OTDR device according to claim 1, wherein the sensor display generator is further executed by the at least one hardware processor to generate the bi-directional combined schematic display by:
- determining, based on an optical continuous wave reflectometer-optical return loss (OCWR)-(ORL) measurement determined by the first OTDR device with respect to the DUT in the direction from the first OTDR device towards the second OTDR device, and an OCWR-ORI, measurement received, over the DUT, from the second OTDR device, a highest OCWR-ORL measurement for the DUT; and
- generating the bi-directional combined schematic display to include an identification of the highest OCWR-ORI, measurement for the DUT.

6. The OTDR device according to claim 1, wherein the connection port includes a single connection port to perform bi-directional measurements without any optical disconnection.

7. The OTDR device according to claim 1, wherein the optical events identified by the first and second OTDRs correspond to a wavelength of the laser beam, and are different from optical events that correspond to a different wavelength of the laser beam.

8. The OTDR device according to claim 1, wherein the sensor display generator is further executed by the at least one hardware processor to ascertain, based on acquisition by the first OTDR device, the further OTDR information that includes the identification of optical events with respect to the DUT in the direction from the first OTDR device towards the second OTDR, device by:
- ascertaining, based on acquisition by the first OTDR device without any optical disconnection from the DUT, the further OTDR information that includes the identification of optical events with respect to the DUT in the direction from the first OTDR device towards the second OTDR device.

9. The OTDR device according to claim 1, wherein the OTDR information acquired by the first OTDR device or the OTDR information acquired by the second OTDR device is filtered to delete an optical event based on an optical event position relative to a splitter.

10. An optical time-domain reflectometer (OTDR) device comprising:
- a laser source to emit a laser beam into a device under test (DUT);
- a connection port to connect the OTDR device to a first end of the DUT, wherein the OTDR device is designated a first OTDR device; and
- a sensor display generator, executed by at least one hardware processor, to:
  - determine, based on the laser beam, a length of the DUT;
  - receive, from a second OTDR device connectable to a second opposite end of the DUT, and over the DUT, OTDR information acquired by the second OTDR device, wherein
    - the OTDR information includes an identification of optical events with respect to the DUT in a direction from the second OTDR device towards the first OTDR device, and
    - the OTDR information is filtered to add or delete an optical event based on a quality criterion and based on an optical event position relative to a splitter;
  - ascertain, based on acquisition by the first OTDR device, further OTDR, information that includes an identification of optical events with respect to the DUT in a direction from the first OTDR device towards the second OTDR device;
  - filter the further OTDR information to add or delete the optical event based on the quality criterion; and
  - generate, based on
    - the determined length of the DUT,
    - the OTDR information received, over the DUT, by the first OTDR device, and
    - the further OTDR information acquired by the first OTDR device, a bi-directional combined schematic display that includes
      - relevant optical events with respect to the DUT.

11. The OTDR, device according to claim 10, wherein the sensor display generator is further executed by the at least one hardware processor to filter the further OTDR information to add or delete the optical event based on the quality criterion by:
- determining that the optical event associated with the OTDR information that includes the identification of optical events with respect to the DUT in the direction from the second OTDR device towards the first OTDR device is identical to the optical event associated with the further OTDR information that includes the identification of the optical events with respect to the DUT in the direction from the first OTDR device towards the second OTDR device; and
- analyzing the optical event to display specified optical event parameters with respect to the optical event.

12. The OTDR device according to claim 11, wherein the specified optical event parameters include at least one of a mean value for attenuation associated with the optical event, a highest reflectance value associated with the optical event, or a distance from the first OTDR device.

13. The OTDR device according to claim 10, wherein the DUT includes an optical fiber.

14. The OTDR device according to claim 10, wherein for a passive optical network (PON) topology, the first end of the DUT corresponds to an optical network terminal (ONT) and the second end of the DUT corresponds to an optical line terminal (OLT).

15. The OTDR device according to claim 10, wherein the sensor display generator is further executed by the at least one hardware processor to generate the bi-directional combined schematic display by:

determining, based on an optical continuous wave reflectometer-optical return loss (OCWR)-(ORL) measurement determined by the first OTDR device with respect to the DUT in the direction from the first OTDR device towards the second OTDR device, and the OCWR-ORL measurement received, over the DUT, from the second OTDR device, a highest OCWR-ORL measurement for the DUT; and generating the bi-directional combined schematic display to include an identification of the highest OCWR-ORL measurement for the DUT.

16. The OTDR device according to claim 10, wherein the connection port includes a single connection port to perform bi-directional measurements without at optical disconnection.

17. The OTDR device according to claim 10, wherein the optical events identified by the first and second OTDRs correspond to a wavelength of the laser beam, and are different from optical events that correspond to a different wavelength of the laser beam.

18. The OTDR device according to claim 10, wherein the sensor display generator is further executed by the at least one hardware processor to ascertain, based on acquisition by the first OTDR device, the further OTDR information that includes the identification of optical events with respect to the DUT in the direction from the first OTDR device towards the second OTDR device by:

ascertaining, based on acquisition by the first OTDR device without any optical disconnection from the DUT, the further OTDR information that includes the identification of optical events with respect to the DUT in the direction from the first OTDR device towards the second OTDR device.

19. A non-transitory computer implemented method comprising:

emitting, by a laser source of an optical time-domain reflectometer (OTDR) device, a laser beam into a device under test (DUT), wherein
        the OTDR device is connectable by a connection port to a first end of the DUT, and
        the OTDR device is designated a first OTDR device;
    determining, based on the laser beam, a length of the DUT;
    receiving, by the first OTDR device, from a second OTDR device connectable to a second opposite end of the DUT, and over the DUT, OTDR information acquired by the second OTDR device, wherein the OTDR information includes an identification of optical events with respect to the DUT in a direction from the second OTDR device towards the first OTDR device;
    ascertaining, based on acquisition by the first OTDR device, further OTDR information that includes an identification of optical events with respect to the DUT in a direction from the first OTDR device towards the second OTDR device;
    generating, by the first OTDR device, based on
        the determined length of the DUT,
        the OTDR information received, over the DUT, by the first OTDR device, and
        the further OTDR information acquired by the first OTDR device, a bi-directional combined schematic display that includes relevant optical events with respect to the DUT; and
    filtering, by the first OTDR device, the further OTDR information acquired by the first OTDR device or the (I)TDR information acquired by the second OTDR device to delete an optical event based on an optical event type.

20. The computer implemented method according to claim 19, wherein the DUT includes an optical fiber.

* * * * *